United States Patent
Hsu

(10) Patent No.: US 9,268,218 B2
(45) Date of Patent: Feb. 23, 2016

(54) PHOTOSENSITIVE RESIN COMPOSITION FOR COLOR FILTER AND APPLICATION THEREOF

(71) Applicant: CHI MEI CORPORATION, Tainan (TW)

(72) Inventor: Jung-Pin Hsu, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 0 days.

(21) Appl. No.: 14/801,818

(22) Filed: Jul. 16, 2015

(65) Prior Publication Data

US 2015/0323863 A1 Nov. 12, 2015

Related U.S. Application Data

(63) Continuation-in-part of application No. 14/645,402, filed on Mar. 11, 2015.

(30) Foreign Application Priority Data

Mar. 24, 2014 (TW) .............................. 103110904 A
Aug. 1, 2014 (TW) .............................. 103126442 A

(51) Int. Cl.
*G02B 5/20* (2006.01)
*G03F 7/033* (2006.01)
*G02F 1/1335* (2006.01)
*G03F 7/00* (2006.01)
*G02B 5/22* (2006.01)
*G02B 1/04* (2006.01)
*G03F 7/30* (2006.01)

(52) U.S. Cl.
CPC ................ *G03F 7/0007* (2013.01); *G02B 1/04* (2013.01); *G02B 5/223* (2013.01); *G02F 1/133516* (2013.01); *G03F 7/033* (2013.01); *G03F 7/30* (2013.01); *G02B 5/201* (2013.01)

(58) Field of Classification Search
CPC ....... G03F 7/0007; G03F 7/032; G03F 7/033; G03F 1/133516; G02B 5/223
USPC ................................... 430/7, 281.1; 349/106
See application file for complete search history.

(56) References Cited

U.S. PATENT DOCUMENTS

2013/0244177 A1    9/2013   Tseng et al.

FOREIGN PATENT DOCUMENTS

| JP | 09-95638 | A |   | 4/1997 |
|----|----------|---|---|--------|
| JP | 09-197663 | A |  | 7/1997 |
| JP | 2004-138950 | A | | 5/2004 |
| JP | 2005-055814 | A | * | 3/2005 |
| JP | 2006-079012 | A | | 3/2006 |
| JP | 2014-041322 | A | * | 3/2014 |
| TW | 201300467 | A |  | 1/2013 |
| TW | 201335670 | A |  | 9/2013 |
| TW | 201344354 | A |  | 11/2013 |

OTHER PUBLICATIONS

Computer-generated translation of JP 2014-041322 (Mar. 2014).*
Computer-generated translation of JP 2005-055814 (Mar. 2005).*

* cited by examiner

*Primary Examiner* — John A McPherson
(74) *Attorney, Agent, or Firm* — CKC & Partners Co., Ltd.

(57) ABSTRACT

The present invention relates to a photosensitive resin composition for a color filter and an application thereof. The photosensitive resin composition includes a pigment (A), an alkali-soluble resin (B), a compound having an ethylenically unsaturated group (C), a photo initiator (D) and an organic solvent (E). The alkali-soluble resin (B) includes a first alkali-soluble resin (B-1), and the first alkali-soluble resin (B-1) is copolymerized by a first mixture. The first mixture at least includes an ethylenically unsaturated monomer having a structure of hindered amine (b1-1), an ethylenically unsaturated monomer having an oxetanyl (b1-2) and an ethylenically unsaturated monomer having a carboxylic acid group (b1-3).

13 Claims, 2 Drawing Sheets

PHOTOSENSITIVE RESIN COMPOSITION FOR COLOR FILTER AND APPLICATION THEREOF

RELATED APPLICATIONS

This is a continuation-in-part application of U.S. application Ser. No. 14/645,402, filed Mar. 11, 2015, which claims priority to Taiwan Application Serial Number 103110904, filed Mar. 24, 2014. This application also claims priority to Taiwan Application Serial Number 103126442, filed Aug. 1, 2014. The entire disclosures of all the above applications are hereby incorporated by reference herein.

BACKGROUND

1. Field of Invention

The present invention relates to a photosensitive resin composition for a color filter and a color filter formed by the photosensitive resin composition of liquid crystal display (LCD) device thereof. More particularly, the present invention relates a photosensitive resin composition for a color filter having excellent alkali resistance and voltage holding ratio.

2. Description of Related Art

At present, a color filter has been widely used in the application fields of a color liquid crystal display (LCD), a color fax machine, a color video camera and the like. With the increasing market requirements of office equipments such as the color LCD and the like, the methods of producing the color filter tend to diversity, and methods such as a dyeing method, a printing method, an electrodeposition method, a dispersing method and the like have been developed progressively. Now, the dispersing method is the major technique for producing the color filter.

In the aforementioned dispersing method, the pigment is dispersed in the photosensitive resin composition. Then, the photosensitive resin is coated on a glass substrate, followed by the steps of exposure and development, for obtaining a specific pattern. Next, the aforementioned steps of coating, exposure and development are repeated in three times, resulting in the desired red (R), green (G) and blue (B) pixel color patterns in the pixel color layer of the color filter. Typically, for further improving the contrast of the color filter, a light-shielding layer (or called a black matrix) is disposed between the pixel color layers that are formed by pixels.

In the pigment dispersing method, the pigment is firstly dispersed in a photo curing resin to form a coloring photosensitive resin composition. The resin composition finally is formed to a pixel color layer. More specifically, in the pigment dispersing method, a black matrix formed by metals (such as chrome, chromic oxide and the like) or a light-shielding film of the photosensitive resin is disposed on a transparent supporter such as glass substrates and the like. Next, the photosensitive resin (color photo-resist) with the red pigment dispersed therein is spin coated on the transparent supporter. Then, the transparent supporter is exposed by a mask, and developed after the exposure, so as to obtain a red pixel. And then, pixels of three colors red, green and blue can be respectively formed on the supporter by repeating the aforementioned steps of coating, exposure and development.

Recently, the application of the color LCD device is not limited to personal computers but also applied to color televisions and various monitors (especially large-size color LCD screen), such that requirements for color saturation of LCD device becomes stricter. Therefore, a ratio of the pigment in the photosensitive resin composition must be increased. However, when the ratio of the pigment is increased, a contrast of the color LCD device is decreased. Moreover, due to the increased ratio of the pigment, the amounts of an alkali-soluble resin and a photosensitive monomer is decreased relatively, resulting in the reduction of a cross-linking degree of the photosensitive resin composition after exposure, and problems of poor alkali resistance.

In the disclosure of JP Patent publication No. 2004-138950, a specific alkali-soluble resin is formed to a pixel color layer with flat surface and a color filter with excellent pattern configurations, alkali resistance and brightness. However, a voltage holding ratio of the conventionally photosensitive resin composition is bad, thereby easily causing a defect of retained image when an image is displayed.

Thus, there is a need to develop the photosensitive resin composition for the color filter with excellent contrast, alkali resistance and voltage holding ratio for improving the aforementioned defects of the general color filter.

SUMMARY

Therefore, an aspect of the present invention provides a photosensitive resin composition for a color filter. The photosensitive resin composition can enhance the alkali resistance and voltage holding ratio of the color filter.

Another aspect of the present invention provides a method of producing a color filter, in which the aforementioned photosensitive resin composition for the color filter is formed to a pixel layer.

A further aspect of the present invention provides a color filter produced by the aforementioned method.

A further aspect of the present invention provides a liquid crystal display (LCD) device, which includes the aforementioned color filter.

According to the aforementioned aspects of the invention, a photosensitive resin composition for a color filter is provided, which comprises a pigment (A), an alkali-soluble resin (B), a compound having an ethylenically unsaturated group (C), a photo initiator (D) and an organic solvent (E), all of which are described in detail as follows.

Photosensitive Resin Composition

Pigment (A)

The pigment (A) of the present invention can be an inorganic pigment, an organic pigment or a combination thereof.

The aforementioned inorganic pigment can be a metallic compound, such as a metallic oxide, a metallic complex salt compound or the like. The metallic oxide can be an oxide of ferrous, cobalt, aluminum, cadmium, lead, copper, titanium, magnesium, chromium, zinc, antimony or the like, and a composite oxide of the aforementioned metal.

The aforementioned organic pigment is selected from C.I. pigment yellow 1, 3, 11, 12, 13, 14, 15, 16, 17, 20, 24, 31, 53, 55, 60, 61, 65, 71, 73, 74, 81, 83, 93, 95, 97, 98, 99, 100, 101, 104, 106, 108, 109, 110, 113, 114, 116, 117, 119, 120, 126, 127, 128, 129, 138, 139, 150, 151, 152, 153, 154, 155, 156, 166, 167, 168, 175; C.I. pigment orange 1, 5, 13, 14, 16, 17, 24, 34, 36, 38, 40, 43, 46, 49, 51, 61, 63, 64, 71, 73; C.I. pigment red 1, 2, 3, 4, 5, 6, 7, 8, 9, 10, 11, 12, 14, 15, 16, 17, 18, 19, 21, 22, 23, 30, 31, 32, 37, 38, 40, 41, 42, 48:1, 48:2, 48:3, 48:4, 49:1, 49:2, 50:1, 52:1, 53:1, 57, 57:1, 57:2, 58:2, 58:4, 60:1, 63:1, 63:2, 64:1, 81:1, 83, 88, 90:1, 97, 101, 102, 104, 105, 106, 108, 112, 113, 114, 122, 123, 144, 146, 149, 150, 151, 155, 166, 168, 170, 171, 172, 174, 175, 176, 177, 178, 179, 180, 185, 187, 188, 190, 193, 194, 202, 206, 207, 208, 209, 215, 216, 220, 224, 226, 242, 243, 245, 254, 255, 264, 265; C.I. pigment violet 1, 19, 23, 29, 32, 36, 38, 39; C.I. pigment blue 1, 2, 15, 15:1, 15:2, 15:3, 15:4, 15:5, 15:6, 16, 21, 22, 60, 61, 64, 66; C.I. pigment green 7, 36, 37, 42, 58; C.I. pigment brown 23, 25, 28; and C.I. pigment black 1, 7.

An average particle size of a primary particle of the pigment (A) is 10 nm to 200 nm, preferably is 20 nm to 150 nm, and more preferably is 30 nm to 130 nm.

Based on a total amount of the following alkali-soluble resin (C) is 100 parts by weight, an amount of the pigment (A) is 30 parts by weight to 300 parts by weight, preferably is 40 parts by weight to 250 parts by weight, and more preferably is 50 parts by weight to 200 parts by weight.

If necessarily, the pigment (A) can selectively include a dispersing agent, such as a cationic surfactant, an anionic surfactant, a non-ionic surfactant, a zwitterions surfactant, a polysiloxane surfactant, a fluoro surfactant or the like.

The surfactant can include but be not limited to polyethylene oxide alkyl ether such as polyethylene oxide lauryl ether, polyethylene oxide stearyl ether, polyethylene oxide oleyl ether and the like; polyethylene oxide alkylphenyl ether surfactant such as polyethylene oxide octyl phenyl ether, polyethylene oxide nonyl phenyl ether and the like; polyethylene glycol diester such as polyethylene glycol bislaurate, polyoxyethylene stearate and the like; sorbitan fatty acid ester; fatty acid modified polyester; tertiary amines modified polyurethane; a product of the trade name of KP manufactured by Shin-Etsu Chemical Co. Ltd.; a product of the trade name of SF-8427 manufactured by Toray Dow Corning Silicon Co. Ltd.; a product of the trade name of Polyflow manufactured by Kyoeisha Chemical Co. Ltd.; a product of the trade name of F-Top manufactured by Tochem Products Co. Ltd.; a product of the trade name of Megafac manufactured by Dainippon Ink and Chemicals Co. Ltd.; a product of the trade name of Fluorade manufactured by Sumitomo 3M Co. Ltd.; a product of and the trade name of Asahi Guard or Surflon manufactured by Asahi Glass Co. Ltd.

Alkali-Soluble Resin (B)

The alkali-soluble resin (B) can comprise a first alkali-soluble resin (B-1). Besides, the alkali-soluble resin (B) can selectively include a second alkali-soluble rein (B-2)

First Alkali-Soluble Resin (B-1)

The first alkali-soluble resin (B-1) is copolymerized by a first mixture, and the first mixture al least comprises an ethylenically monomer having a hindered-amine structure (b1-1), an ethylenically unsaturated monomer having an oxetanyl group (b1-2) and an ethylenically unsaturated monomer having a carboxyl group (b1-3). Besides, the first mixture can selectively include an other copolymerizable ethylenically unsaturated monomer (b1-4) except from the ethylenically monomer having a hindered-amine structure (b1-1), an ethylenically unsaturated monomer having an oxetanyl group (b1-2) and the ethylenically unsaturated monomer having a carboxyl group (b1-3).

Ethylenically Monomer Having Hindered-Amine Structure (b1-1)

The ethylenically monomer having a hindered-amine structure (b1-1) can include an unsaturated monomer having a structure of Formula I:

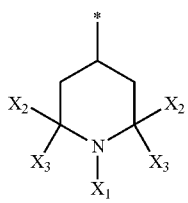

(I)

in the Formula (I), the $X_1$ represents a hydrogen atom, a linear-alkyl group of 1 to 18 carbons, a branched-alkyl group of 3 to 18 carbons, a cyclo-alkyl group of 3 to 18 carbons, an aromatic group of 6 to 20 carbons, an aromatic alkyl group of 7 to 12 carbons, an acyl group, an oxygen free radical or —$OX_4$; the $X_4$ represents a hydrogen atom, a linear-alkyl group of 1 to 18 carbons, a branched-alkyl group of 3 to 18 carbons, a cyclo-alkyl group of 1 to 18 carbons, an aromatic group of 6 to 20 carbons, or an aromatic alkyl group of 7 to 12 carbons; the $X_2$ and the $X_3$ individually and independently represents methyl, ethyl, phenyl or aliphatic ring bound by 4 to 12 carbons; and the symbol "*" represents a covalent bond.

When the $X_1$ and the $X_4$ represents the linear-alkyl group of 1 to 18 carbons, a branched-alkyl group of 3 to 18 carbons, a cyclo-alkyl group of 3 to 18 carbons, the $X_1$ and the $X_4$ can be methyl, ethyl, n-propyl, isopropyl, n-butyl, t-butyl, n-hexyl, cyclohexyl, n-octyl, cetyl and the like. When the $X_1$ represents an aromatic group of 6 to 20 carbons, the examples can be phenyl group, α-naphthyl or β-naphthyl. When the $X_1$ and the $X_4$ represents the aromatic alkyl group of 7 to 12 carbon atoms, the $X_1$ and the $X_4$ can be the aromatic group bound with the alkyl group of 1 to 8 carbons, and carbon atoms of the aromatic group is 6 to 10, the examples can be benzyl group, ethylbenzene group, α-methyl benzyl group, or 2-phenyl propane-2-yl. When the $X_1$ and the $X_4$ represents the acyl group, $X_1$ and the $X_4$ can be the alkyl acyl group or the aromatic acyl group of 2 to 8 carbons, and the examples of the $X_1$ and the $X_4$ can be an acetyl or a benzoyl.

The $X_1$ can preferably be a hydrogen atom, an alkyl group of 1 to 5 carbons or an oxygen free radical, in which the hydrogen atom, oxygen free radical and methyl group are more preferable.

Moreover, the $X_2$ and the $X_3$ in the Formula (I) can bind to form a structure of aliphatic ring, and the examples can be cyclopentane, cyclohexane or the like. The $X_2$ and the $X_3$ can preferably be a methyl group.

The unsaturated monomer having a structure of Formula (I) can have a structure shown as Formula (I-1) and Formula (I-2):

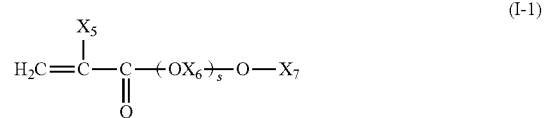

(I-1)

(I-2)

in the Formula (I-1) and Formula (I-2), the $X_5$ and the $X_8$ independently and individually represents a hydrogen atom or a methyl group; the $X_6$ represents a methylene or alkylmethylene of 2 to 5 carbons; the $X_7$ represents the structure shown as Formula (I); the $X_9$ represents —CONH—*, —$SO_2$—, —$SO_2NH$—*, in which the "*" represents a covalent bond bound with the $X_7$; s is an integer of 0 to 8, and more preferably is 0 to 6

Preferably, the $X_6$ is ethylene or propylene, and more preferably is ethylene.

The aforementioned unsaturated monomer having a structure of Formula (I-1) can be structures shown as Formula (I-1-1) to Formula (I-1-7):

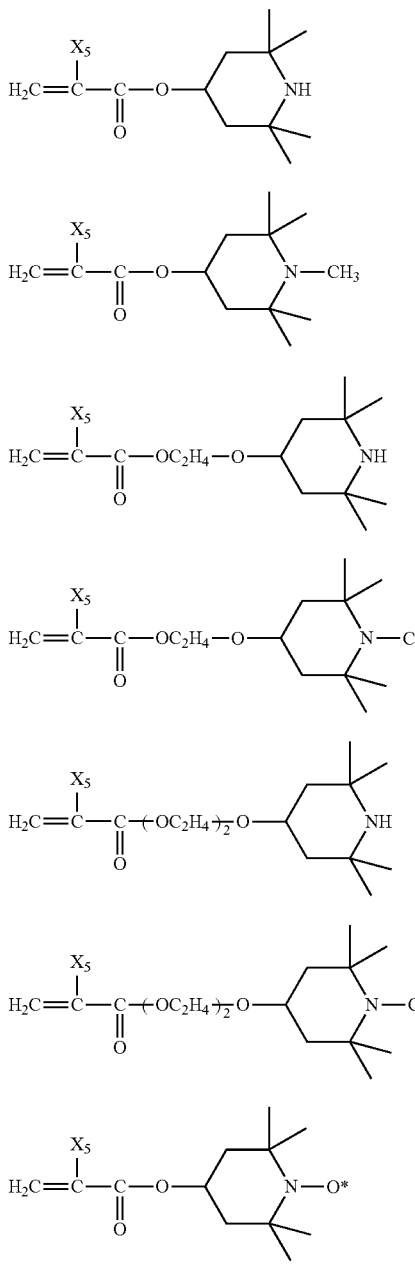

(I-1-1)
(I-1-2)
(I-1-3)
(I-1-4)
(I-1-5)
(I-1-6)
(I-1-7)

in the Formulas (I-1-1) to (I-1-7), the $X_5$ is defined as the aforementioned description rather than being mentioned repetitively.

The aforementioned unsaturated monomer having a structure of Formula (I-2) can be structures shown as Formula (I-2-1) to Formula (I-2-4):

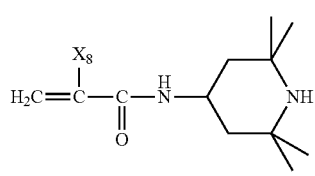

(I-2-1)

-continued

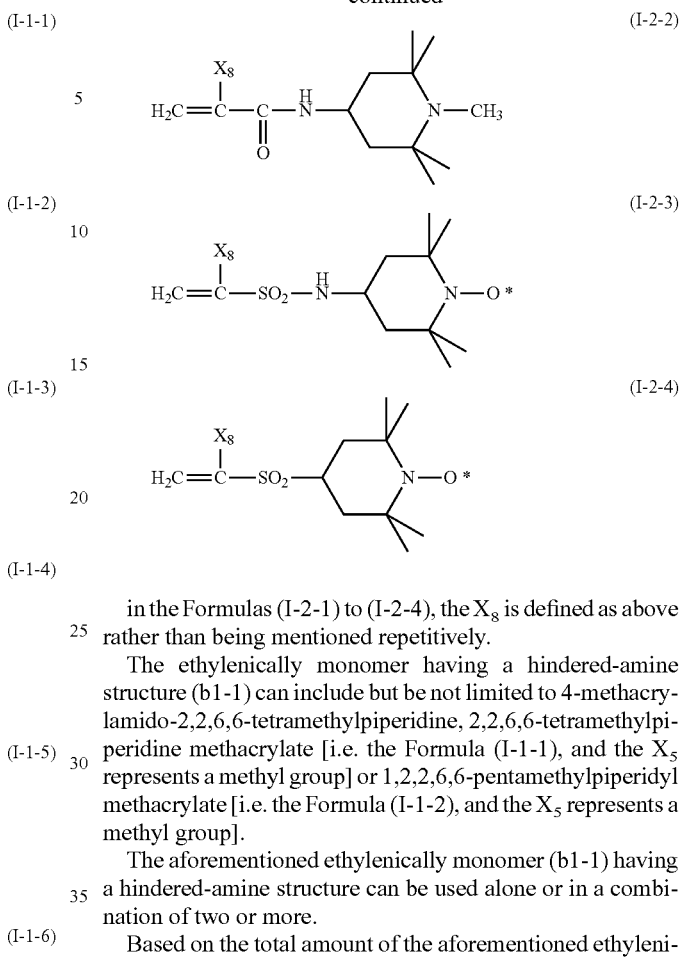

(I-2-2)
(I-2-3)
(I-2-4)

in the Formulas (I-2-1) to (I-2-4), the $X_8$ is defined as above rather than being mentioned repetitively.

The ethylenically monomer having a hindered-amine structure (b1-1) can include but be not limited to 4-methacrylamido-2,2,6,6-tetramethylpiperidine, 2,2,6,6-tetramethylpiperidine methacrylate [i.e. the Formula (I-1-1), and the $X_5$ represents a methyl group] or 1,2,2,6,6-pentamethylpiperidyl methacrylate [i.e. the Formula (I-1-2), and the $X_5$ represents a methyl group].

The aforementioned ethylenically monomer (b1-1) having a hindered-amine structure can be used alone or in a combination of two or more.

Based on the total amount of the aforementioned ethylenically monomer having a hindered-amine structure (b1-1), the following ethylenically unsaturated monomer having an oxetanyl group (b1-2), and the ethylenically unsaturated monomer having a carboxyl group (b1-3) and the other copolymerizable ethylenically unsaturated monomer (b1-4) as 100 parts by weight, an amount of the ethylenically monomer having a hindered-amine structure (b1-1) is 5 parts by weight to 50 parts by weight, preferably 10 parts by weight to 40 parts by weight, and more preferably 10 parts by weight to 30 parts by weight.

Ethylenically Unsaturated Monomer Having Oxetanyl Group (b1-2)

The ethylenically unsaturated monomer having an oxetanyl group (b1-2) includes an unsaturated monomer having a structure of Formula (II):

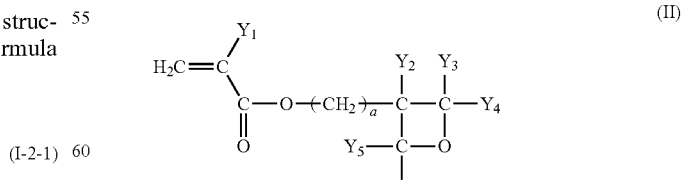

(II)

in the Formula (II), the $Y_1$ represents a hydrogen atom or an alkyl group of 1 to 4 carbons and the $Y_2$ represents a hydrogen atom or an alkyl group of 1 to 4 carbons; the $Y_3$, the $Y_4$, the $Y_5$ and the $Y_6$ individually and independently represent a hydrogen atom, a fluorine atom, a phenyl group, an alkyl group of 1 to 4 carbons or a perfluroalkyl group of 1 to 4 carbons; and the a represents an integer of 1 to 6.

The examples of the unsaturated monomer shown as Formula (II) can include but be not limited to a methacrylate ester compound, an acrylate ester compound or an unsaturated monomer having structures of Formula (II-1) to Formula (II-4).

The aforementioned methacrylate ester compound can include but be not limited to 3-(methacryloylmethoxy)oxetane (OXMA), 3-(methacryloyl methoxy)-3-ethyloxetane (EOXMA), 3-(methacryloylmethoxy)-3-methyloxetane, 3-(methacryloylmethoxy)-2-methyloxetane, 3-(methacryloylmethoxy)-2-trifluoromethyloxetane, 3-(methacryloylmethoxy)-2-pentafluoroethyloxetane, 3-(methacryloylmethoxy)-2-phenyloxetane, 3-(methacryloylmethoxy)-2,2-difluorooxetane, 3-(methacryloylmethoxy)-2,2,4-trifluorooxetane, 3-(methacryloylmethoxy)-2,2,4,4-tetrafluorooxetane, 3-(methacryloylethoxy)oxetane, 3-(methacryloylethoxy)-3-ethyloxetane, 2-ethyl-3-(methacryloylethoxy)oxetane, 3-(methacryloylethoxy)-2-trifluoromethyloxetane, 3-(methacryloylethoxy)-2-pentafluoroethyloxetane, 3-(methacryloylethoxy)-2-phenyloxetane, 2,2-difluoro-3-(methacryloylethoxy)oxetane, 3-(methacryloylethoxy)-2,2,4-trifluorooxetane, 3-(methacryloylethoxy)-2,2,4,4-tetrafluorooxetane or the like.

The aforementioned acrylate ester compound can include but be not limited to 3-(acryloylmethoxy)oxetane, 3-(acryloylmethoxy)-3-ethyloxetane, 3-(acryloylmethoxy)-3-methyloxetane, 3-(acryloylmethoxy)-2-methyloxetane, 3-(acryloylmethoxy)-2-trifluoromethyloxetane, 3-(acryloylmethoxy)-2-pentafluoroethyloxetane, 3-(acryloylmethoxy)-2-phenyloxetane, 3-(acryloylmethoxy)-2,2-difluorooxetane, 3-(acryloylmethoxy)-2,2,4-trifluorooxetane, 3-(acryloylmethoxy)-2,2,4,4-tetrafluorooxetane, 3-(acryloylethoxy)oxetane, 3-(acryloylethoxy)-3-ethyloxetane, 2-ethyl-3-(acryloylethoxy)oxetane, 3-(acryloylethoxy)-2-trifluoromethyloxetane, 3-(acryloylethoxy)-2-pentafluoroethyloxetane, 3-(acryloylethoxy)-2-phenyloxetane, 2,2-difluo-3-(acryloylethoxy)oxetane, 3-(acryloylethoxy)-2,2,4-trifluorooxetane, 3-(acryloylethoxy)-2,2,4,4-tetrafluorooxetane or the like.

The aforementioned unsaturated monomer having structures of Formula (II-1) to Formula (II-4) is shown as following:

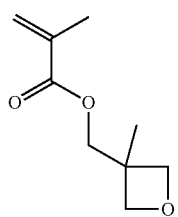

(II-1)

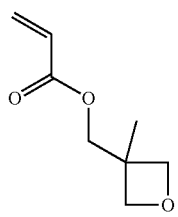

(II-2)

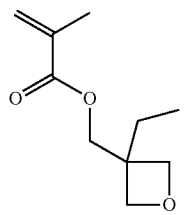

(II-3)

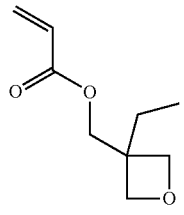

(II-4)

The other ethylenically unsaturated monomer having an oxetanyl group can include but be not limited to 3-methyl-3-(vinylmethoxy)oxetane (MOXV), 3-ethyl-3-(vinylmethoxy)oxetane (EOXV), 3-propyl-3-(vinylmethoxy)oxetane, 3-methyl-3-(2-vinylethoxy)oxetane, 3-ethyl-3-(2-vinylethoxy)oxetane, 3-propyl-3-(2-vinylethoxy)oxetane, 3-methyl-3-(3-vinylpropoxy)oxetane, 3-ethyl-3-(3-vinylpropoxy)oxetane, 3-propyl-3-(3-vinylpropoxy)oxetane, 3-methyl-3-(3-vinylbutoxy)oxetane, 3-ethyl-3-(3-vinylbutoxy)oxetane, 3-propyl-3-(3-vinylbutoxy)oxetane, ethylene glycol[(3-ethyl-3-oxetanyl)methyl]vinyl ether, propylene glycol[(3-ethyl-3-oxetanyl)methyl]vinyl ether, 3,3-bis[(vinyloxy)methyl]oxetane or the like.

Based on the total amount of the aforementioned ethylenically monomer having a hindered-amine structure (b1-1), the ethylenically unsaturated monomer having an oxetanyl group (b1-2), the following ethylenically unsaturated monomer having a carboxyl group (b1-3) and the other copolymerizable ethylenically unsaturated monomer (b1-4) as 100 parts by weight, an amount of the ethylenically unsaturated monomer having an oxetanyl group (b1-2) is 10 parts by weight to 60 parts by weight, preferably 15 parts by weight to 60 parts by weight, and more preferably 20 parts by weight to 55 parts by weight.

When the first alkali-soluble resin (B-1) does not include the ethylenically unsaturated monomer having an oxetanyl group (b1-2) as the copolymerized monomer, the produced color filter has a defect of poor alkali resistance.

Ethylenically Unsaturated Monomer Having Carboxyl Groups (b1-3)

The ethylenically unsaturated monomer having a carboxylic group (b1-3) can be an unsaturated monomer having one or more carboxylic groups.

The ethylenically unsaturated monomer having a carboxyl group (b1-3) can include but be not limited to an unsaturated monocarboxylic compound, such as acrylic acid, methacrylic acid, butenic acid, α-chloro acrylic acid, ethyl acrylic acid, benzacetic acid, 2-acryloyloxyethylsuccinate monoester, 2-methacryloyloxyethyl succinate monoester or the like; an unsaturated dicarboxylic acid (anhydride) compound, such as maleic acid, maleic anhydride, fumaric acid, itaconic acid, itaconic anhydride, citraconic acid, citraconic anhydride or the like; or a unsaturated polycarboxylic acid (anhydride) compound having more than three carboxyl groups.

Preferably, the ethylenically unsaturated monomer having a carboxyl group (b1-3) is selected from the group consisting of acrylic acid, methacrylic acid, 2-acryloyloxyethyl succinate monoester or 2-methacryloyloxyethyl succinate monoester, in which the 2-acryloyloxyethyl succinate monoester or the 2-methacryloyloxyethyl succinate monoester is more preferable.

Based on the total amount of the aforementioned ethylenically monomer having a hindered-amine structure (b1-1), the ethylenically unsaturated monomer having an oxetanyl group (b1-2), the ethylenically unsaturated monomer having a carboxyl group (b1-3) and the following other copolymerizable ethylenically unsaturated monomer (b1-4) as 100 parts by weight, an amount of the ethylenically unsaturated monomer having a carboxyl group (b1-3) is 10 parts by weight to 40 parts by weight, preferably 12 parts by weight to 35 parts by weight, and more preferably 15 parts by weight to 30 parts by weight.

Other Copolymerizable Ethylenically Unsaturated Monomer (b1-4)

The aforementioned first mixture can selectively include the other copolymerizable ethylenically unsaturated monomer (b1-4), and the other copolymerizable ethylenically unsaturated monomer (b1-4) can include but be not limited to aromatic ethylenically compounds such as styrene (SM), α-methylstyrene, vinyl toluene, p-chlorostyrene, methoxystyrene or the like; maleimide compounds such as N-phenylmaleimide (PMI), N-o-hydroxyphenylmaleimide, N-m-hydroxyphenylmaleimide, N-p-hydroxyphenylmaleimide, N-o-methylphenylmaleimide, N-m-methylphenylmaleimide, N-p-methylphenylmaleimide, N-o-methoxyphenylmaleimide, N-m-methoxyphenylmaleimide, N-p-methoxyphenylmaleimide, N-cyclohexylmaleimide or the like; unsaturated carboxylic acid ester compounds such as methyl acrylate (MA), methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, sec-butyl acrylate, sec-butyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, propylene acrylate, propylene methacrylate, benzyl acrylate, benzyl methacrylate (BzMA), phenyl acrylate, phenyl methacrylate, methoxy triethylene glycol acrylate, methoxy triethylene glycol methacrylate, dodecyl methacrylate, tetradecyl methacrylate, hexadecyl methacrylate, octadecyl methacrylate, eicosyl methacrylate, docosanyl methacrylate, dicyclopentenyloxyethyl acrylate (DCPOA) or the like; acrylic compounds such as N,N-dimethyl amino ethyl acrylate, N,N-dimethyl amino ethyl methacrylate, N,N-diethyl amino propyl acrylate, N,N-dimethyl amino propyl methacrylate, N,N-dibutyl amino propyl acrylate, isobutyl amino ethyl methacrylate or the like; unsaturated carboxylic epoxypropyl ester compounds such as epoxypropyl acrylate, epoxypropyl methacrylate or the like; vinyl carboxylate compounds such as vinyl acetate, vinyl pivalate, vinyl butanoate or the like; unsaturated ether compounds such as methoxyethene, ethoxyethene, allyl epoxypropyl ether, methallyl epoxypropyl ether or the like; vinyl nitrile compounds such as acrylonitrile, methacrylonitrile, α-chloro acrylonitrile, vinylidene cyanide or the like; unsaturated amide compounds such as acrylamide, methacrylamide, α-chloro acrylamide, N-hydroxyethyl acrylamide, N-hydroxyethyl methacrylamide or the like; and aliphatic conjugated diene compounds such as 1,3-butadiene, isoprene, chlorinated butadiene or the like.

Preferably, the other copolymerizable ethylenically unsaturated monomer (b1-4) can be styrene, N-phenylmaleimide, methacrylate, methyl methacrylate, 2-hydroxyethyl acrylate, 2-hydroxyethyl methacrylate, benzyl acrylate, benzyl methacrylate or dicyclopentenyloxyethyl acrylate.

The other copolymerizable ethylenically unsaturated monomer (b1-4) can be used alone or in a combination two or more.

Based on the total amount of the aforementioned ethylenically monomer having a hindered-amine structure (b1-1), the ethylenically unsaturated monomer having an oxetanyl group (b1-2), the ethylenically unsaturated monomer having a carboxyl group (b1-3) and the other copolymerizable ethylenically unsaturated monomer (b1-4) as 100 parts by weight, an amount of the other copolymerizable ethylenically unsaturated monomer (b1-4) is 5 part by weight to 75 parts by weight, preferably 10 parts by weight to 65 parts by weight, and more preferably 15 parts by weight to 55 parts by weight.

Based on the total amount of the alkali-soluble resin (B) as 100 parts by weight, an amount of the first alkali-soluble resin (B-1) is 30 parts by weight to 100 parts by weigh, preferable is 40 parts by weight to 90 parts by weight, and more preferably is 50 parts by weight to 80 parts by weight.

Second Alkali-Soluble Resin (B-2)

The alkali-soluble resin (B) of the present invention can optionally include the second alkali-soluble resin (B-2), and the second alkali-soluble resin (B-2) is obtained by reacting with a second mixture.

The aforementioned second mixture includes an epoxy compound having at least two epoxy groups (b2-1) and a compound having at least one carboxyl group and at least one ethylenically unsaturated group (b2-2). Moreover, the second mixture can selectively include a carboxylic anhydride compound (b2-3), a compound having an epoxy group (b2-4) or a combination thereof.

Epoxy Compound Having at Least Two Epoxy Groups (b2-1)

The epoxy compound having at least two epoxy groups (b2-1) includes a compound having structures of Formula (III), Formula (IV) or a combination thereof:

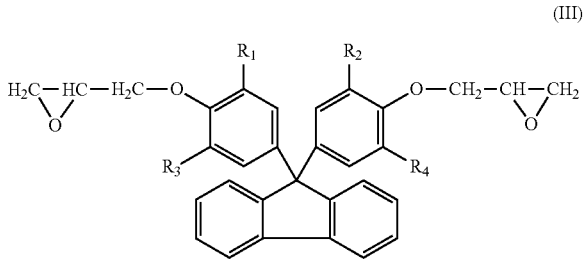

in formula (III), $R_1$, $R_2$, $R_3$ and $R_4$ are independently represent a hydrogen atom, a halogen atom, an alkyl group of 1 to 5 carbons, an alkoxy group of 1 to 5 carbons, an aryl group of 1 to 12 carbons or an aralkyl group of 6 to 12 carbons.

The compound having a structure of formula (III) can obtained by reacting bisphenol fluorene and epihalohydrin.

For examples, the aforementioned bisphenol fluorene can include but be not limited to 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, 9,9-bis(4-hydroxy-3,5-dibromophenyl)fluorene, and the like.

The aforementioned epihalohydrin can include but be not limited to epichlorohydrin, epibromohydrin or a combination thereof.

The aforementioned bisphenol fluorine can include but be not limited to commercial products, manufactured by Nippon Steel Chemical Co. Ltd., and the trade names are ESF-300 or the like, products manufactured by Osaka Gas Co. Ltd., and the trade names are PG-100, EG-210 or the like, products manufactured by S.M.S. Technology Co. Ltd., and the trade names are SMS-F9PhPG, SMS-F9CrG, SMS-F914PG or the like.

The aforementioned halogen atom represents chlorine or bromine. The alkyl group represents methyl group, ethyl group, or t-butyl group. The alkoxy group represents methoxy group or ethoxy group.

The aforementioned phenol compounds can include but be not limited to phenol, cresol, ethylphenol, n-propylphenol, isobutylphenol, t-butylphenol, octylphenol, nonylphenol, xylenol, methylbutylphenol, di-t-butylphenol, vinylphenol,

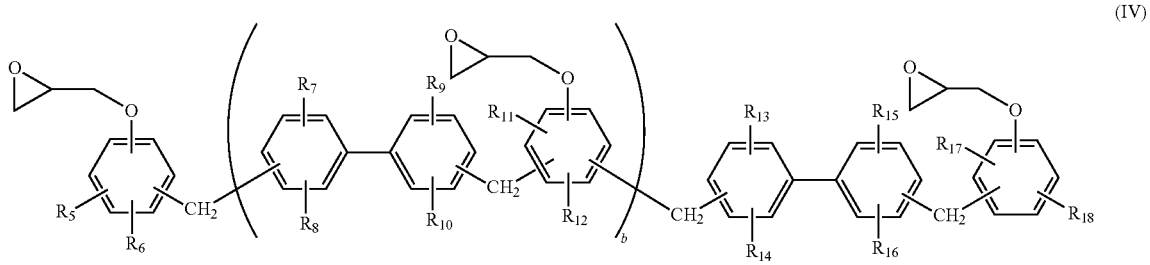

(IV)

In formula (IV), $R_5$ to $R_{18}$ independently represent a hydrogen atom, a halogen atom, an alkyl group of 1 to 8 carbons, an aryl group of 6 to 15 carbons, and b represents an integer from 0 to 10.

Preferably, the compound having a structure of formula (IV) is obtained by reacting a compound having a structure of Formula (IV-1) and epihalohydrin in the presence of alkali metal hydroxides:

propenylphenol, ethynylphenol, cyclopentylphenol, cyclohexylphenol, cyclohexylcresol or the like. The aforementioned phenol compounds can be used alone or in a combination of two or more.

Based on an amount of the compound having a structure of Formula (III-2) as 1 mole, an amount of phenol compounds is 0.5 moles to 20 moles, and preferably is 2 to 15 moles.

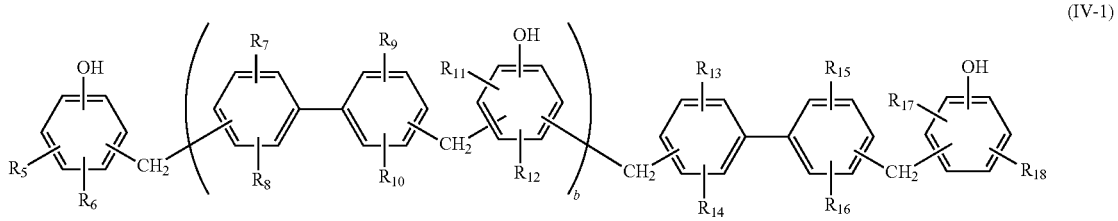

(IV-1)

in formula (IV-1), $R_5$ to $R_{18}$ and b are defined as the aforementioned description rather than being mentioned repetitively.

A synthetic method of a compound having a structure of Formula (IV-1) is subjecting a compound having a structure of Formula (IV-2) and phenol compound to a condensation reaction, so as to obtain the compound having a structure of Formula (IV-1). Then, excess epihalohydrin is added to subject the compound having a structure of Formula (IV-1) to dehydrohalogenation, thereby obtaining the compound having a structure of Formula (IV):

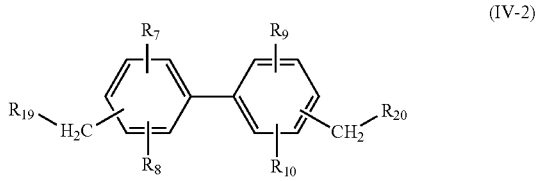

(IV-2)

in Formula (IV-2), $R_7$ to $R_{10}$ are defined as the aforementioned description rather than being mentioned repetitively; $R_{19}$ and $R_{20}$ independently represent a halogen, an alkyl group of 1 to 6 carbons or an alkoxy group of 1 to 6 carbons.

The aforementioned acid catalyst can include but be not limited to hydrochloric acid, sulfuric acid, p-toluenesulfonic acid, oxalic acid, boron trifluoride, aluminium chloride anhydrous, zinc chloride or the like. Preferably, the acid catalyst is p-toluenesulfonic acid, sulfuric acid, hydrochloric acid or a combination thereof.

There is no specific limitation to the amount of the acid catalyst. Based on an amount of the compound having a structure of Formula (IV-2) as 100 wt %, the amount of the acid catalyst preferably is 0.1 wt % to 30 wt %.

The aforementioned condensation reaction can be performed in the absence of solvents or in the presence of organic solvents. The organic solvents can include but be not limited to toluene, xylene, methyl isobutyl ketone or the like. The aforementioned organic solvents can be used alone or in a combination of two or more.

Based on the compound having a structure of formula (IV-2) as 100 wt %, the amount of the organic solvent preferably is 50 wt % to 300 wt %, and more preferably is 100 wt % to 250 wt %. Besides, the condensation reaction is performed at 40° C. to 180° C. for 1 hour to 8 hours.

After the aforementioned condensation reaction is completed, neutralization treatment or rinsing treatment can be performed. The neutralization treatment is used to adjust the pH value of the solution to 3 to 7, and preferably is 5 to 7. The rinsing treatment is performed with a neutralizing agent, and the neutralizing agent is a basic compound. The neutralizing agent can be alkali metal hydroxides, such as sodium hydroxide, potassium hydroxide or the like; alkaline earth metal hydroxides, such as calcium hydroxide, magnesium hydroxide or the like; organic amines, such as diethylene triamine, triethylene tetramine, aniline, phenylene diamine or the like; ammonia, sodium dihydrogen phosphate or a combination thereof. The neutralizing agent can be used alone or in a combination of two or more. The aforementioned rinsing treatment can be performed in a conventional method. For example, the reacted solution is repeatedly extracted by adding an aqueous solution containing the neutralizing agent.

After the neutralization or rinsing treatment is completed, the unreacted phenols and solvents can be removed by distillation at a reduced pressure, and then the residue solution is concentrated to obtain the compound having a structure of formula (IV-1).

The aforementioned epihalohydrin can include but be not limited to 3-chloro-1,2-epoxypropane, 3-bromo-1,2-epoxypropane or a combination thereof. Before the aforementioned dehydrohalogenation reaction is performed, alkaline metal hydroxides, such as sodium hydroxide, potassium hydroxide or the like can be added prior to or during the reaction. The aforementioned dehydrohalogenation is performed at 20° C. to 120° C. for 1 hour to 10 hours.

In an embodiment, the aforementioned alkaline metal hydroxides added in the dehydrohalogenation can be an aqueous solution thereof. In this embodiment, when the aforementioned alkaline metal hydroxide aqueous solution is continuously added to the dehydrohalogenation, the water and epihalohydrin can be simultaneously and continuously distilled at atmospheric pressure or at a reduced pressure, so as to remove the water, and the epihalohydrin can be continuously refluxed into the reaction system.

Before the aforementioned dehydrohalogenation reaction is performed, quaternary ammonium salts, such as tetramethyl ammonium chloride, tetramethyl ammonium bromide, trimethyl benzyl ammonium chloride and the like can be added as a catalyst, and reacting at 50° C. to 150° C. for 1 hour to 5 hours. Then, alkaline metal hydroxide or an aqueous solution thereof is added, and the dehydrohalogenation reaction is performed at 20° C. to 120° C. for 1 hour to 10 hours.

Based on the total equivalent of hydroxyl groups in the compound having a structure of formula (IV-1) as 1 equivalent, the equivalent of the epihalohydrin is 1 equivalent to 20 equivalents, and preferably is 2 equivalents to 10 equivalents. Based on the total equivalent of hydroxyl groups in the compound with the structure in formula (III-1) as 1 equivalent, an equivalent of the alkaline metal hydroxide that was added to the aforementioned dehydrohalogenation is 0.8 equivalents to 15 equivalents, and preferably is 0.9 equivalents to 11 equivalents.

In order to smoothly perform the aforementioned dehydrohalogenation, alcohols, such as methanol, ethanol or the like are added. Besides, aprotic polar solvents, such as dimethyl sulfone, dimethyl sulfoxide or the like can also added to perform the reaction. When the alcohols are added, based on a total amount of the epihalohydrin as 100 wt %, an amount of alcohols can be 2 wt % to 20 wt %, and preferably is 4 wt % to 15 wt %. When the aprotic polar solvent is added, based on a total amount of the epihalohydrin as 100 wt %, an amount of the aprotic polar solvent can be 5 wt % to 100 wt %, and preferably is 10 wt % to 90 wt %.

After the dehydrohalogenation is completed, the rinse treatment can be optionally performed. Then, the epihalohydrin, the alcohols and the aprotic polar solvent are removed in an environment at 110° C. to 250° C., and the pressure of the environment is less than 1.3 kPa (10 mmHg).

To prevent the resulting epoxy resin from containing hydrolysable halogens, solvents, such as toluene, methyl isobutyl ketone or the like, and alkali metal hydroxide solutions, such as sodium hydroxide, potassium hydroxide or the like can be added to the reacted solution to perform the dehydrohalogenation again. During the dehydrohalogenation, based on the total equivalent of hydroxyl groups in the compound having a structure of formula (III-1) as 1 equivalent, the equivalent of alkali metal hydroxide is 0.01 moles to 0.3 moles, and preferably is 0.05 moles to 0.2 moles. The aforementioned dehydrohalogenation is performed at 50° C. to 120° C. for 0.5 hours to 2 hours.

After the dehydrohalogenation is completed, salts can be removed by performing filtration step, rinse step and the like. In addition, solvents, such as toluene, methyl isobutyl ketone or the like can be removed by distillation at reduced pressure, thereby obtaining the compound shown as Formula (IV). The aforementioned compound shown as Formula (IV) can include but be not limited to commercial products manufactured by Nippon Kayaku Co. Ltd., and the trade names are NC-3000, NC-3000H, NC-3000S, NC-3000P or the like.

Compound Having at Least One Carboxyl Group and at Least One Ethylenically Unsaturated Group (b2-2)

The aforementioned compound having at least one carboxyl group and at least one ethylenically unsaturated group (b2-2) is selected from the group consisting of the following subgroups (1) to (3): (1) acrylic acid, methacrylic acid, 2-methacryloyloxyethyl butanedioic acid, 2-methacryloyloxybutyl butanedioic acid, 2-methacryloyloxyethyl hexanedioic acid, 2-methacryloyloxybutyl hexanedioic acid, 2-methacryloyloxyethyl hexahydrophthalic acid, 2-methacryloyloxyethyl maleic acid, 2-methacryloyloxypropyl maleic acid, 2-methacryloyloxybutyl maleic acid, 2-methacryloyloxypropyl butanedioic acid, 2-methacryloyloxypropyl hexanedioic acid, 2-methacryloyloxypropyl tetrahydrophthalic acid, 2-methacryloyloxypropyl hydrophthalic acid, 2-methacryloyloxybutyl hydrophthalic acid or 2-methacryloyloxybutyl hydrophthalic acid; (2) a compound obtained by reacting (methyl)acrylate esters having hydroxyl group(s) and dicarboxylic acid compound, and the dicarboxylic acid compound can include but be not limited to hexanedioic acid, butanedioic acid, maleic acid or phthalic acid; and (3) a hemiester compound obtained by reacting (methyl)acrylate ester having hydroxyl group(s) and following carboxylic anhydride compound (b2-3), and the (methyl)acrylate esters having hydroxyl group(s) can include but be not limited to (2-hydroxyethyl)acrylate, (2-hydroxyethyl)methacrylate, (2-hydroxypropyl)acrylate, (2-hydroxypropyl)methacrylate, (4-hydroxybutyl)acrylate, (4-hydroxybutyl)methacrylate, pentaerythritol triacrylate or the like.

Carboxylic Anhydride Compound (b2-3)

The aforementioned carboxylic anhydride compound (b2-3) can be selected from the group consisting of the following subgroups (1) and (2): (1) dicarboxylic acid anhydride compounds, such as butanedioic anhydride, maleic anhydride, itaconic anhydride, phthalic anhydride, tetrahydrophthalic anhydride, hexahydrophthalic anhydride, methyltetrahydrophthalic anhydride, methylhexahydrophthalic anhydride, methyl endo-methylene tetrahydrophthalic anhydride, chlorendic anhydride, 1,3-dioxoisobenzofuran-5-carboxylic anhydride or the like; and (2) tetracarboxylic acid anhydride compounds, such as benzophenone tetracarboxylic dianhydride (BTDA), diphenyl tetracarboxylic dianhydride, diphenyl ether tetracarboxylic add dianhydride or the like.

Compound Having an Epoxy Group (b2-4)

The aforementioned compound having an epoxy group (b2-4) can be selected from the group consisting of glycidyl methacrylate, 3,4-epoxycyclohexyl methacrylate, glycidyl ether compounds having unsaturated group(s), unsaturated compounds having epoxy group(s) or a combination thereof.

The aforementioned glycidyl ether compounds having unsaturated group(s) can include but be not limited to commercial products manufactured by Nagase ChemteX Corporation, and the trade names are Denacol EX-111, Denacol EX-121, Denacol EX-141, Denacol EX-145, Denacol EX-146, Denacol EX-171, Denacol EX-192 or the like.

The second alkali-soluble resin (B-2) can be a reacted product having a hydroxy group obtained by polymerizing the epoxy compound having at least two epoxy groups (b2-1) and the compound having at least one carboxyl group and at least one ethylenically unsaturated group (b2-2). The epoxy compound having at least two epoxy groups (b2-1) can include the compound having a structure of Formula (III), the compound having a structure of Formula (IV) or a combination thereof. Then, the carboxylic anhydride compound (b2-3) is added into the reacting solution to perform the polymerized reaction. Based on the total equivalent of hydroxyl groups of the reacted product having a hydroxyl group as 1 equivalent, the equivalent of anhydride groups in the carboxylic anhydride compound (b2-3) is preferably 0.4 equivalents to 1 equivalent, and more preferably is 0.75 equivalents to 1 equivalent. When a plurality of the carboxylic anhydride compounds (b2-3) are applied, they can be added sequentially or simultaneously into the reaction. When a dicarboxylic acid anhydride compound and a tetracarboxylic acid anhydride compound are used as the carboxylic anhydride compound (b2-3), the molar ratio of the dicarboxylic acid anhydride compound and the tetracarboxylic acid anhydride compound is preferably 1:99 to 90:10, and more preferably is 5:95 to 80:20. In addition, the aforementioned reaction can be performed at 50° C. to 130° C.

The second alkali-soluble resin (B-2) can be a reacted product having a hydroxy group obtained by polymerizing the epoxy compound having at least two epoxy groups (b2-1) and the compound having at least one carboxyl group and at least one ethylenically unsaturated group (b2-2). The epoxy compound having at least two epoxy groups (b2-1) can be the compound having a structure of Formula (III) or the compound having a structure of Formula (IV). Then, the carboxylic anhydride compound (b2-3), the compound having an epoxy group (b2-4) or a combination thereof are added into the reacting solution to perform the polymerized reaction. Based on the total equivalent of epoxy groups of the compound having a structure of Formula (III) or Formula (IV) as 1 equivalent, the acid value equivalent of the aforementioned compound having at least one carboxyl group and at least one vinyl unsaturated group (b2-2) is preferably 0.8 equivalents to 1.5 equivalents, and more preferably is 0.9 equivalents to 1.1 equivalents. Based on the hydroxyl groups in the aforementioned reacted product having a hydroxyl group as 100 mole %, the amount of the carboxylic anhydride compound (b2-3) is 10 mole % to 100 mole %, preferably is 20 mole % to 100 mole %, and more preferably is 30 mole % to 100 mole %.

When the aforementioned second alkali-soluble resin (b-2) is prepared, alkaline compounds are usually added to the reacting solution as a reacting catalyst to decrease the reaction time. The reacting catalyst can include but be not limited to triphenyl phosphine, triphenyl stibine, triethylamine, triethanolamine, tetramethylammonium chloride, benzyltriethylammonium chloride or the like. The reacting catalyst can be used alone or in a combination of two or more.

Based on the total amount of the epoxy compound having at least two epoxy groups (b1-2) and the compound having at least one carboxyl group and at least one vinyl unsaturated group (b2-2) as 100 parts by weight, the amount of the reacting catalyst is preferably 0.01 parts by weight to 10 parts by weight, and more preferably is 0.3 parts by weight to 5 parts by weight.

Moreover, a polymerization inhibitor is added into the reacting solution to control the polymerization degree. The polymerization inhibitor can include methoxyphenol, methyl hydroquinone, hydroquinone, 2,6-di-t-butyl-p-cresol, phenothiazine or the like. The polymerization inhibitor can be used alone or in a combination of two or more.

Based on the total amount of the epoxy compound having at least two epoxy groups (b2-1) and the compound having at least one carboxyl group and at least one vinyl unsaturated group (b2-2) as 100 parts by weight, the amount of the polymerization inhibitor is preferably 0.01 parts by weight to 10 parts by weight, and more preferably is 0.1 parts by weight to 5 parts by weight.

When the second alkali-soluble resin (B-2) is prepared, a polymerization solvent can be optionally used. The polymerization solvent can include alcohols, such as ethanol, propanol, isopropanol, butanol, isobutanol, 2-butanol, hexanol, ethylene glycol or the like; ketones, such as methyl ethyl ketone, cyclohexanone or the like; aromatic hydrocarbon, such as toluene, xylene or the like; cellosolve compounds, such as cellosolve, butyl cellosolve or the like; carbitol compounds, such as carbitol, butyl carbitol or the like; propylene glycol alkyl ether compounds, such as propylene glycol monomethyl ether or the like; poly(propylene glycol) alkyl ether compounds, such as di(propylene glycol) methyl ether or the like; acetate ester compounds, such as ethyl acetate, butyl acetate, ethylene glycol monoethyl ether acetate, propylene glycol methyl ether acetate or the like; alkyl lactate compounds, such as ethyl lactate, butyl lactate or the like; or dialkyl glycol ether compounds. The polymerization solvent can be used alone or in a combination of two or more.

The acid value of the second alkali-soluble resin (B-2) is preferably 50 mgKOH/g to 200 mgKOH/g, and more preferably is 60 mgKOH/g to 150 mgKOH/g.

Based on the total amount of the alkali-soluble resin (B) as 100 parts by weight, an amount of the second alkali-soluble resin (B-2) is 30 parts by weight to 70 parts by weigh, preferable is 30 parts by weight to 60 parts by weight, and more preferably is 30 parts by weight to 50 parts by weight.

When the alkali-soluble resin (B) includes the first alkali-soluble resin (B-1) and second alkali-soluble resin (B-2), based on the total amount of the alkali-soluble resin (B) as 100 parts by weight, an amount of the first alkali-soluble resin (B-1) is 30 parts by weight to 70 parts by weigh, and an amount of the second alkali-soluble resin (B-2) is 30 parts by weight to 70 parts by weight.

When the alkali-soluble resin (B) includes the second alkali-soluble resin (B-2), the photosensitive resin composition for the color filter has better alkali resistance.

Compound Having an Ethylenically Unsaturated Group (C)

The compound having an ethylenically unsaturated group (C) of the present invention can include a first compound modified by alkoxy Group, a second compound modified by a caprolactone group, a third compound that is excluded from the first compound modified by the alkoxy group and the second compound modified by the caprolactone group or a combination thereof.

First Compound Modified by Alkoxy Group

The first compound modified by alkoxy Group can include but be not limited to a compound having a structure of Formula (V), a compound having a structure of Formula (VI), a compound having a structure of Formula (VII) or a combination thereof:

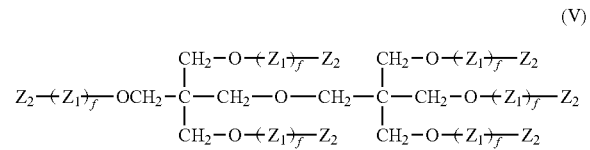
(V)

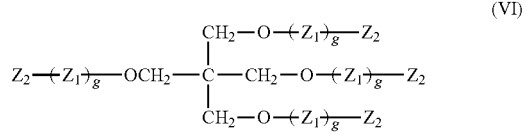
(VI)

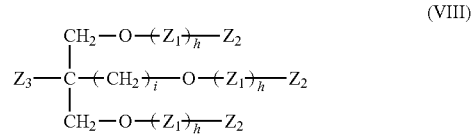
(VIII)

in Formulas (V) to (VII), $Z_1$ individually and independently represents $-(CH_2CH_2O)-$ or $-(CH_2CH(CH_3)O)-$; $Z_2$ individually and independently represents an acryloyl group, a methacryloyl group or a hydrogen atom; $Z_3$ individually and independently represents a hydrogen atom, an alkyl group of 1 to 6 carbon atoms or an aromatic group of 1 to 6 carbon atoms; in Formula (V), the total amounts of the acryloyl group and methacryloyl group are 5 or 6; in Formula (VI), the total amounts of the acryloyl group and methacryloyl group are 3 or 4; in Formula (VII), the total amounts of the acryloyl group and methacryloyl group are 3; f individually and independently represents an integer of 0 to 6 and the sum of f is 3 to 24; g individually and independently represents an integer of 0 to 6 and the sum of g is 2 to 16; h individually and independently represents an integer of 0 to 10 and the sum of h is 3 to 30; and i represents an integer of 0 to 3.

In Formulas (V) to (VII), when $Z_1$ represents $-(CH_2CH_2O)-$ or $-(CH_2CH(CH_3)O)-$, $Z_1$ is preferably bound to $Z_2$ via an oxygen atom.

In Formula (V), $Z_2$ is preferably an acryloyl group.

The compound listed as Formula (V) or Formula (VI) can be synthesized by the following steps. Firstly, through a ring-opening addition reaction performed by ethylene oxide or propylene oxide, pentaerythritol or dipentaerythritol are reacted and formed into a ring-opened backbone. Then, (meth)acryloyl chloride is reacted with a terminal hydroxyl group of the ring-opened backbone to form the (meth)acryloyl group.

The compounds listed as Formulas (V) and (VI) are more preferably pentaerythritol derivatives, dipentaerythritol derivatives or a combination thereof.

The examples of the compound listed as Formula (V) can include but be not limited to compounds listed as Formulas (V-1) to (V-3):

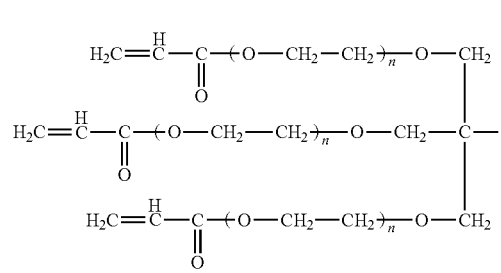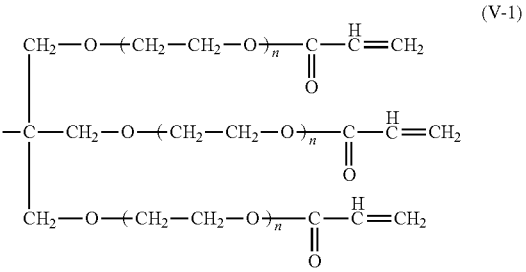
(V-1)

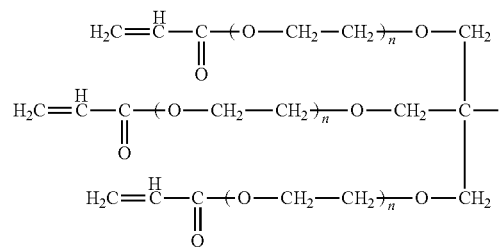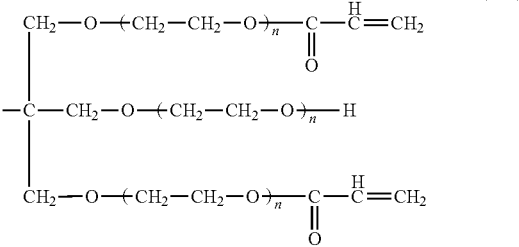
(V-2)

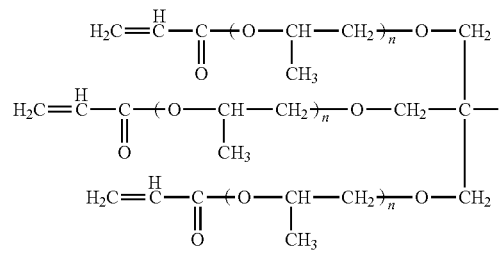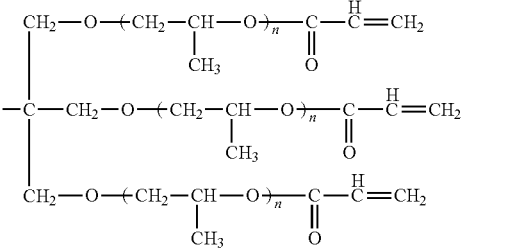
(V-3)

in Formula (V-1), the sum of n can be 6 or 12. In Formula (V-2), the sum of n is 12. In the Formula (V-3), the sum of n is 6.

Preferably, the compound listed as Formula (V) can be the one listed as Formula (V-1).

The examples of the compound listed as Formula (VI) can include but be not limited to a compound listed as following Formula (VI-1), ethoxylated pentaerythritol tetraacrylate or propoxylated pentaerythritol tetraacrylate:

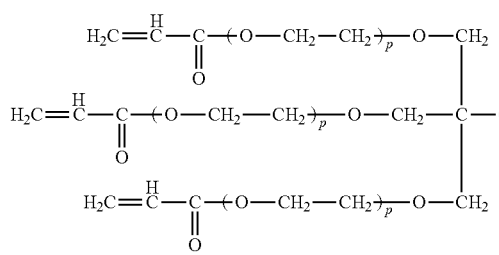

(VI-1)

in Formula (VI-1), the sum of p can be 4 or 12.

The compound listed as Formula (VI) can be commercial products, for example, the products of the trade name of EM2411 or EM2421 manufactured by Eternal Materials Co. Ltd. (Taiwan) or the products of the trade name of Miramer M4004 manufactured by Toyo Kagaku Co. Ltd. (Japan).

The examples of the aforementioned compound listed as Formula (VII) can include but be not limited to ethoxylated trihydroxymethylpropyltriacrylate, ethoxylated trihydroxymethylpropyl trimethacrylate, propoxylated trihydrxymethylpropyl triacrylate or propoxylated glyceryl triacrylate.

The compound listed as Formula (VII) can be commercial products, for example, the products of the trade names of KAYARAD GPO-303, KAYARAD THE-330, KAYARAD TPA-320 or KAYARAD TPA-330 manufactured by Nippon Kayaku Co. Ltd.; the products of the trade names of M-310, M-321, M-350, M-360 or M-460 manufactured by Toagosei Co. Ltd.; the products of the trade name of SR415, SR454, SR492, SR499, CD501, SR502, SR9020, SR9021 or SR9035 manufactured by Sartomer Co. Ltd.; products of the trade name of EM2380, EM2381, EM2382, EM2383, EM2384, EM2385, EM2386, EM2387 or EM3380 manufactured by Eternal Materials Co. Ltd.; products of the trade name of Miramer M3130, Miramer M3160, Miramer M3190 or Miramer M360 manufactured by Toyo Kagaku Co. Ltd. The aforementioned compounds can be used alone or in a combination of two or more.

Second Compound Modified by Caprolactone Group

The second compound modified by the caprolactone group can include a compound listed as Formula (VIII):

in Formula (VIII), $Z_4$ and $Z_5$ individually and independently represent a hydrogen group and a methyl group; m represents an integer of 1 to 2; j represents an integer of 1 to 6; k represents an integer of 0 to 5; and the sum of j and k is 2 to 6.

The second compound modified by the caprolactone group can be a (meth)acrylate compound that is obtained by a reaction between a polyol modified by the caprolactone group and (meth)acrylic acid.

The aforementioned polyol modified by the caprolactone group is formed by the reaction between caprolactone and a polyol with more than 4 functional groups. The aforementioned caprolactone can be γ-caprolactone, δ-caprolactone, ε-caprolactone or a combination thereof, and preferably ε-caprolactone.

The aforementioned polyol with more than 4 functional groups can be pentaerythritol, ditrimethylolpropane, dipentaerythritol or a combination thereof.

Based on an amount of the polyol with more than 4 functional groups is 1 mole, the amount of the aforementioned caprolactone preferably 1 mole to 12 moles.

The examples of the second compound modified by the caprolactone group can include but be not limited a tetra (meth)acrylate compound modified by pentaerythritol, a tetra (meth)acrylate compound modified by ditrimethyloipropane, a poly(meth)acrylate compound modified by dipentaerythritol or a combination thereof.

The examples of the aforementioned poly(meth)acrylate compound modified by dipentaerythritol can be a di(meth) acrylate compound modified by dipentaerythritol, a tri(meth) acrylate compound modified by dipentaerythritol, a tetra (meth)acrylate compound modified by dipentaerythritol, a penta(meth)acrylate compound modified by dipentaerythritol, a hexa(meth)acrylate compound modified by dipentaerythritol or a combination thereof.

The second compound modified by the caprolactone group can be products of the trade name of KAYARAD DPCA-20, KAYARAD DPCA-30, KAYARAD DPCA-60 or DPCA-120 manufactured by Nippon Kayaku Co. Ltd.

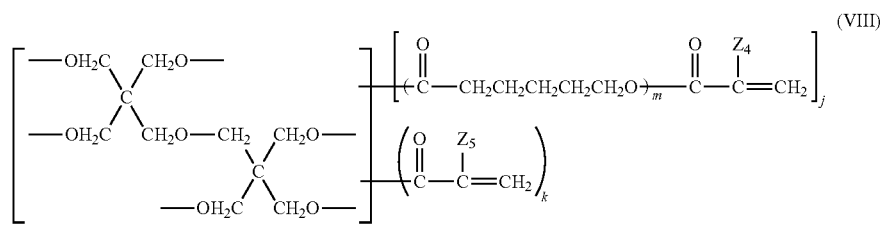

(VIII)

Third Compound

The third other compound has the functional group listed as Formula (IX):

in Formula (IX), $R_1$ represents a hydrogen atom or a methyl group.

The examples of the third compound can be acrylamide, (meth)acryloyl morpholine, (meth)acrylate-7-amino-3,7-dimethyloctyl ester, isobutoxy methyl (meth)acrylamide, isobornyl ethoxy (meth)acrylate, isobornyl (meth)acrylate, 2-ethyl-hexyl (meth)acrylate, ethyl diethylene glycol (meth)acrylate, tertoctyl (meth)acrylamide, diacetone (meth)acrylamide, dimethylamino (meth)acrylate, dodecyl (meth)acrylate, dicyclopentenyl ethoxy (meth)acrylate, dicyclopentenyl (meth)acrylate, N,N-dimethyl(meth)acrylamide, tetrachlorophenyl (meth)acrylate, 2-tetrachlorophenoxyl ethyl (meth)acrylate, tetrahydrofurfuryl (meth)acrylate, tetrabromophenyl (meth)acrylate, 2-tetrabromophenoxylethyl (meth) acrylate, 2-trichlorophenoxylethyl (meth)acrylate, tribromophenyl (meth)acrylate, 2-tribromophenoxylethyl (meth)acrylate, 2-hydroxyethyl (meth)acrylate, 2-hydroxypropyl (meth)acrylate, vinyl caprolactam, N-vinyl pyrrolidone, ethyl phenoxyl (meth)acrylate, pentachlorophenyl (meth)acrylate, pentabromophenyl (meth)acrylate, polyethylene glycol mono(meth)acrylate, polypropylene glycol mono(meth)acrylate, bronyl (meth)acrylate, ethylene glycol di(meth)acrylate, dicyclopentenyl di(meth)acrylate, triethylene glycol di(meth)acrylate, tetraethylene glycol di(meth)acrylate, tri(2-hydroxyethyl)isocyanate di(meth)acrylate, tri (2-hydroxyethyl)isocyanate tri(meth)acrylate, caprolactone modified tri(2-hydroxyethyl)isocyanate tri(meth)acrylate, trihydroxymethylolpropane tri(meth)acrylate, triethylene glycol di(meth)acrylate, neopropyl glycol di(meth)acrylate, 1,4-butylene glycol di(meth)acrylate, 1,6-hexadiol di(meth) acrylate, trihydroxymethylpropyl triacrylate, pentaerythritol tri(meth)acrylate, dipentaerythritol hexaacrylate, pentaerythritol tetra(meth)acrylate, polyester di(meth)acrylate, polyethylene glycol di(meth)acrylate, dipentaerythritol hexa(meth) acrylate, dipentaerythritol penta(meth)acrylate, dipentaerythritol tetra(meth)acrylate, di(trihydroxymethylpropane) tetra(meth)acrylate, ethylene glycol (hereinafter as EO) modified bisphenol A di(meth)acrylate, propylene glycol (hereinafter as PO) modified bisphenol A di(meth)acrylate, EO modified hydrobisphenol A di(meth)acrylate, PO modified hydrobisphenol A di(meth)acrylate, EO modified bisphenol F di(meth)acrylate, novolac polyglycidyl ether (meth)acrylate, or a combination thereof.

Preferably, the third compound can be trihydroxymethylpropane triacrylate, pentaerythritol triacrylate, pentaerythritol tetraacrylate, dipentaerythritol hexaacrylate, dipentaerythritol pentaacrylate, dipentaerythritol tetraacrylate, di(trihydroxmethylpropane) tetraacrylate, products of the trade name of TO-1382 manufactured by Toagosei Co. Ltd. (Japan) or a combination thereof.

Based on the total amount of the alkali soluble resin (B) is 100 parts by weight, an amount of the compound having the ethylenically unsaturated group (C) is 40 parts by weight to 400 parts by weight, preferably 50 parts by weight to 300 parts by weight, and more preferably 60 parts by weight to 200 parts by weight.

Photo Initiator (D)

The photo initiator (D) can be O-acyl oxime compound, triazine compound, acetonephenone compound, biimidazole compound, benzophenone compound or the like.

The O-acyl oxime compound includes but is not limited to 1-[4-(phenylthio)phenyl]-heptane-1,2-dione-2-(O-benzoyl oxime), 1-[4-(phenylthio)phenyl]-octane-1,2-dione-2-(O-benzoyl oxime), 1-[4-(benzoyl)phenyl]-heptane-1,2-dione-2-(O-benzoyl oxime), 1-[9-ethyl-6-(2-methylbenzoyl)-9H-carbazol-3-yl]-ethanone-1-(O-acetyl oxime), 1-[9-ethyl-6-(3-methylbenzoyl)-9H-carbazol-3-yl]-ethanone-1-(O-acetyl oxime), 1-[9-ethyl-6-benzoyl-9H-carbazol-3-yl]-ethanone-1-(O-acetyl oxime), ethanone-1-[9-ethyl-6-(2-methyl-4-tetrahydrofuranyl benzoyl)-9H-carbazol-3-yl]-1-(O-acetyl oxime), ethanone-1-[9-ethyl-6-(2-methyl-5-tetrahydropyranyl benzoyl)-9H-carbazol-3-yl]-1-(O-acetyl oxime), ethanone-1-[9-ethyl-6-(2-methyl-4-tetrahydrofuranyl methoxybenzoyl)-9H-carbazol-3-yl]-1-(O-acetyl oxime), ethanone-1-[9-ethyl-6-(2-methyl-5-tetrahydrofuranyl methoxybenzoyl)-9H-carbazole-3-yl]-1-(O-acetyl oxime), ethanone-1-{9-ethyl-6-[2-methyl-4-(2,2-dimethyl-1,3-dioxolanyl)benzoyl]-9H-car bazol-3-yl}-1-(O-acetyl oxime), ethanone-1-{9-ethyl-6-[2-methyl-4-(2,2-dimethyl-1,3-dioxolanyl)methoxybenzoyl]-9H-carbazol-3-yl}-1-(O-acetyl oxime) or a combination thereof.

The triazine compound includes but is not limited to 2,4-bis(trichloromethyl)-6-(p-methoxy)styryl-s-triazine, 2,4-bis(trichloromethyl)-6-(1-p-dimethylaminophenyl-1,3-butadienyl)-s-triazine, or 2-trichloromethyl-4-amino-6-(p-methoxy)styryl-s-triazine or a combination thereof.

The acetophenone compound includes but is not limited to p-dimethylamino acetophenone, α,α'-dimethoxyazoxy acetophenone, 2,2'-dimethyl-2-phenyl acetophenone, p-methoxy acetophenone, 2-methyl-1-(4-methylthio phenyl)-2-morpholino-1-acetone, 2-benzyl-2-N,N-dimethylamino-1-(4-morpholino phenyl)-1-butanone or a combination thereof.

The biimidazole compound includes but is not limited to 2,2'-bis(o-chlorophenyl)-4,4',5,5'-tetraphenyl biimidazole, 2,2'-bis(o-fluorophenyl)-4,4',5,5'-tetraphenyl biimidazole, 2,2'-bis(o-methylphenyl)-4,4',5,5'-tetraphenyl biimidazole, 2,2'-bis(o-methoxyphenyl)-4,4',5,5'-tetraphenyl biimidazole, 2,2'-bis(o-ethylphenyl)-4,4',5,5'-tetraphenyl biimidazole, 2,2'-bis(p-methoxyphenyl)-4,4',5,5'-tetraphenyl biimidazole, 2,2'-bis(2,2',4,4'-tetramethoxyphenyl)-4,4',5,5'-tetraphenyl biimidazole, 2,2'-bis(2-chlorophenyl)-4,4',5,5'-tetraphenyl biimidazole, 2,2'-bis(2,4-dichlorophenyl)-4,4',5,5'-tetraphenyl biimidazole or a combination thereof.

The benzophenone compound includes but is not limited to thiaxanthone, 2,4-diethyl thiaxanthone, thiaxanthone-4-sulfone, benzophenone, 4,4'-bis(dimethylamino)benzophenone, 4,4'-bis(diethylamino)benzophenone or a combination thereof.

The aforementioned compound can be used alone or in a combination of two or more.

Preferably, the photo initiator (D) can be 1-[4-(phenylthio) phenyl]-octane-1,2-dione-2-(O-benzoyl oxime), 1-[9-ethyl-6-(2-methylbenzoyl)-9H-carbazol-3-yl]-ethanone-1-(O-acetyl oxime), ethanone-1-[9-ethyl-6-(2-methyl-4-tetrahydrofuranyl methoxybenzoyl)-9H-carbazol-3-yl]-1-(O-acetyl oxime), ethanone-1-{9-ethyl-6-[2-methyl-4-(2,2-dimethyl-1,3-dioxolanyl)methoxybenzoyl]-9H-carbazol-3-yl}-1-(O-acetyl oxime), 2,4-bis(trichloromethyl)-6-(p-methoxy)styryl-s-triazine, 2-benzyl-2-N,N-dimethylamino-1-(4-morpholino phenyl)-1-butanone, 2,2'-bis(2,4-dichlorophenyl)-4,4',5,5'-tetraphenyl-1,2'-biimidazole, 4,4'-bis(diethylamino)benzophenone or a combination thereof.

Based on the total amount of the aforementioned alkali-soluble resin (B) as 100 parts by weight, an amount of the photo initiator (D) is 10 parts by weight to 100 parts by weight, preferably 15 parts by weight to 80 parts by weight, and more preferably 20 parts by weight to 60 parts by weight.

Organic Solvent (E)

The organic solvent (E) can dissolve the aforementioned pigment (A), the alkali-soluble resin (B), the compound having the ethylenically unsaturated group (C), the photo initiator (D), and the following dye (F) and the additive (G). Moreover, the organic solvent (E) does not react with the aforementioned compounds and has a suitable volatility.

The organic solvent (E) includes but is not limited to a (poly)alkylene glycol monoalkyl ether solvent, such as ethylene glycol methyl ether, ethylene glycol ethyl ether, diethylene glycol methyl ether, diethylene glycol ethyl ether, diethylene glycol n-propyl ether, diethylene glycol n-butyl ether, triethylene glycol methyl ether, triethylene glycol ethyl ether, propylene glycol methyl ether, propylene glycol ethyl ether, dipropylene glycol monomethyl ether, dipropylene glycol monoethyl ether, dipropylene glycol n-propyl ether, dipropylene glycol n-butyl ether, tripropylene glycol methyl ether, tripropylene glycol ethyl ether or the like; (poly)alkylene glycol monoalkyl ether acetate solvent, such as ethylene glycol methyl ether acetate, ethylene glycol ethyl ether acetate, propylene glycol methyl ether acetate (PGMEA), propylene glycol ethyl ether acetate or the like; an other ether solvent such as diethylene glycol dimethyl ether, diethylene glycol ethyl methyl ether, diethylene glycol diethyl ether, tetrahydrofuran or the like; a ketone solvent, such as ethyl methylketone, cyclohexanone, 2-heptanone, 3-heptanone or the like; an alkyl lactate solvent such as methyl 2-hydroxypropanoate, ethyl 2-hydroxypropanoate or the like; an other ester solvent such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate (EEP), ethyl ethoxyacetate, ethyl hydroxyacetate, methyl 2-hydroxy-3-methyl butyrate, 3-methyl-3-methoxybutyl acetate, 3-methyl-3-methoxybutyl propionate, ethyl acetate, n-propyl acetate, isopropyl acetate, n-butyl acetate, isobutyl acetate, n-pentyl acetate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, ethyl 2-methoxybutyrate or the like; an aromatic hydrocarbon compound solvent such as toluene, xylene or the like; and an amide solvent such as N-methylpyrrolidone, N,N-dimethylformamide, N,N-dimethyl acetamide or the like.

The aforementioned organic solvent (E) can be used alone or in a combination of two or more.

Preferably, the organic solvent (E) can be propylene glycol monomethyl ether acetate or ethyl 3-ethoxypropionate.

Based on the total amount of the aforementioned alkali-soluble resin (B) as 100 parts by weight, an amount of the organic solvent (E) is 500 parts by weight to 5000 parts by weight, preferably 1000 parts by weight to 4500 parts by weight, and more preferably 1500 parts by weight to 4000 parts by weight.

Dye (F)

The photosensitive resin composition of the present invention can selectively include the dye (F). The dye (F) preferably is the dye that is used for a color filter with high brightness and high contrast. The dye (F) of the present invention can include but be not limited to the following examples.

The examples of a red dye are C.I. acid red 1, 2, 3, 4, 5, 6, 7, 8, 9, 10, 11, 12, 13, 14, 15, 16, 17, 18, 19, 20, 22, 23, 24, 25, 25:1, 26, 26:1, 26:2, 27, 29, 30, 31, 32, 33, 34, 35, 36, 37, 39, 40, 41, 42, 43, 44, 45, 47, 50, 52, 53, 54, 55, 56, 57, 59, 60, 62, 64, 65, 66, 67, 68, 70, 71, 73, 74, 76, 76:1, 80, 81, 82, 83, 85, 86, 87, 88, 89, 91, 92, 93, 97, 99, 102, 104, 106, 107, 108, 110, 111, 113, 114, 115, 116, 120, 123, 125, 127, 128, 131, 132, 133, 134, 135, 137, 138, 141, 142, 143, 144, 148, 150, 151, 152, 154, 155, 157, 158, 160, 161, 163, 164, 167, 170, 171, 172, 173, 175, 176, 177, 181, 229, 231, 237, 239, 240, 241, 242, 249, 252, 253, 255, 257, 260, 263, 264, 266, 267, 274, 274, 280, 286, 289, 299, 306, 309, 311, 323, 333, 324, 325, 326, 334, 335, 336, 337, 340, 343, 344, 347, 348, 350, 351, 353, 354, 356, 388 or the like.

Moreover, the red dye also can be C.I. direct red 2:1, 4, 5, 6, 7, 8, 10, 10:1, 13, 14, 15, 16, 17, 18, 21, 22, 23, 24, 26, 26:1, 28, 29, 31, 33, 33:1, 34, 35, 36, 37, 39, 42, 43, 43:1, 44, 46, 49, 52, 53, 54, 55, 56, 57, 58, 59, 60, 61, 62, 67, 67:1, 68, 72, 72:1, 73, 74, 75, 77, 78, 79, 81, 81:1, 85, 86, 88, 89, 90, 97, 100, 101, 101:1, 107, 108, 110, 114, 116, 117, 120, 121, 122, 122:1, 124, 125, 127, 127:1, 127:2, 128, 129, 130, 132, 134, 135, 136, 137, 138, 140, 141, 148, 149, 150, 152, 153, 154, 155, 156, 169, 171, 172, 173, 174, 175, 176, 177, 179, 180, 181, 182, 185, 186, 189, 204, 211, 213, 214, 217, 222, 224, 225, 226, 227, 228, 232, 236, 237, 238 or the like.

A yellow dye can be C.I. acid yellow 2, 3, 4, 5, 6, 7, 8, 9, 9:1, 10, 11, 11:1, 12, 13, 14, 15, 16, 17, 17:1, 18, 20, 21, 22, 23, 25, 26, 27, 29, 30, 31, 33, 34, 36, 38, 39, 40, 40:1, 41, 42, 42:1, 43, 44, 46, 48, 51, 53, 55, 56, 60, 63, 65, 66, 67, 68, 69, 72, 76, 82, 83, 84, 86, 87, 90, 94, 105, 115, 117, 122, 127, 131, 132, 136, 141, 142, 143, 144, 145, 146, 149, 153, 159, 166, 168, 169, 172, 174, 175, 178, 180, 183, 187, 188, 189, 190, 191, 192, 199 or the like.

Moreover, the yellow dye can also be C.I. direct yellow 1, 2, 4, 5, 12, 13, 15, 20, 24, 25, 26, 32, 33, 34, 35, 41, 42, 44, 44:1, 45, 46, 48, 49, 50, 51, 61, 66, 67, 69, 70, 71, 72, 73, 74, 81, 84, 86, 90, 91, 92, 95, 107, 110, 117, 118, 119, 120, 121, 126, 127, 129, 132, 133, 134 or the like.

A orange dye can be C.I. acid orange 1, 1:1, 4, 5, 6, 7, 8, 9, 10, 12, 14, 16, 17, 18, 19, 20, 20:1, 22, 23, 24, 24:1, 25, 27, 28, 28:1, 30, 31, 33, 35, 36, 37, 38, 41, 45, 49, 50, 51, 54, 55, 56, 59, 79, 83, 94, 95, 102, 106, 116, 117, 119, 128, 131, 132, 134, 136, 138 or the like.

Moreover, the orange dye can also be C.I. direct orange 1, 2, 3, 4, 5, 6, 7, 8, 10, 13, 17, 19, 20, 21, 24, 25, 26, 29, 29:1, 30, 31, 32, 33, 43, 49, 51, 56, 59, 69, 72, 73, 74, 75, 76, 79, 80, 83, 84, 85, 87, 88, 90, 91, 92, 95, 96, 97, 98, 101, 102, 102:1, 104, 108, 112, 114 or the like.

A blue dye can be C.I. acid blue 1, 2, 3, 4, 5, 6, 7, 8, 9, 11, 13, 14, 15, 17, 19, 21, 22, 23, 24, 25, 26, 27, 29, 34, 35, 37, 40, 41, 41:1, 43, 44, 45, 46, 47, 48, 49, 50, 51, 52, 53, 54, 55, 56, 57, 58, 62, 62:1, 63, 64, 65, 68, 69, 70, 73, 75, 78, 79, 80, 81, 83, 84, 85, 86, 88, 89, 90, 90:1, 91, 92, 93, 95, 96, 99, 100, 103, 104, 108, 109, 110, 111, 112, 113, 114, 116, 117, 118, 119, 120, 123, 124, 127, 127:1, 128, 129, 135, 137, 138, 143, 145, 147, 150, 155, 159, 169, 174, 175, 176, 183, 198, 203, 204, 205, 206, 208, 213, 227, 230, 231, 232, 233, 235, 239, 245, 247, 253, 257, 258, 260, 261, 262, 264, 266, 269, 271, 272, 273, 274, 277, 278, 280 or the like.

Moreover, the blue dye can also be C.I. direct blue 1, 2, 3, 4, 6, 7, 8, 8:1, 9, 10, 12, 14, 15, 16, 19, 20, 21, 21:1, 22, 23, 25, 27, 29, 31, 35, 36, 37, 40, 42, 45, 48, 49, 50, 53, 54, 55, 58, 60, 61, 64, 65, 67, 79, 96, 97, 98:1, 101, 106, 107, 108, 109, 111, 116, 122, 123, 124, 128, 129, 130, 130:1, 132, 136, 138, 140, 145, 146, 149, 152, 153, 154, 156, 158, 158:1, 164, 165, 166, 167, 168, 169, 170, 174, 177, 181, 184, 185, 188, 190, 192, 193, 206, 207, 209, 213, 215, 225, 226, 229, 230, 231, 242, 243, 244, 253, 254, 260, 263 or the like.

A violet dye can be C.I. acid violet 1, 2, 3, 4, 5, 5:1, 6, 7, 7:1, 9, 11, 12, 13, 14, 15, 16, 17, 19, 20, 21, 23, 24, 25, 27, 29, 30, 31, 33, 34, 36, 38, 39, 41, 42, 43, 47, 49, 51, 63, 67, 72, 76, 96, 97, 102, 103, 109 or the like.

Moreover, the violet dye can be C.I. direct violet 1, 3, 4, 5, 6, 7, 8, 9, 10, 11, 12, 13, 14, 16, 17, 18, 21, 22, 25, 26, 27, 28, 29, 30, 31, 32, 34, 35, 36, 37, 38, 39, 40, 41, 42, 43, 45, 51, 52, 54, 57, 58, 61, 62, 63, 64, 71, 72, 77, 78, 79, 80, 81, 82, 83, 85, 86, 87, 88, 93, 97 or the like.

A green dye can be C.I. acid green 2, 3, 5, 6, 7, 8, 9, 10, 11, 13, 14, 15, 16, 17, 18, 19, 20, 22, 25, 25:1, 27, 34, 36, 37, 38, 40, 41, 42, 44, 54, 55, 59, 66, 69, 70, 71, 81, 84, 94, 95 or the like.

Moreover, the green dye can also be C.I. direct green 11, 13, 14, 24, 30, 34, 38, 42, 49, 55, 56, 57, 60, 78, 79, 80 or the like.

Based on a total amount of the alkali-soluble resin (B) as 100 parts by weight, an amount of the dye (F) is 4 parts by weight to 40 parts by weight, preferably is 5 parts by weight to 35 parts by weight, and more preferably is 6 parts by weight to 30 parts by weight.

Based on the total amount of the alkali-soluble resin (B) as 100 parts by weight and the amount of the dye (F) is 4 parts by weight to 40 parts by weight, the photosensitive resin composition has better contrast.

Additive (G)

The photosensitive resin composition can selectively include an additive (G) without affecting the efficiency of the present invention. The examples of the additive (G) can include a filling agent, a polymer compound except for the aforementioned alkali-soluble resin (B), an adhesion promoter, an antioxidant, an ultraviolet absorber, and an antifocculant.

The examples of the filling agent can include glass, aluminum or the like.

The examples of the polymer compound can include polyvinyl alcohol, polyethylene glycol monoalkyl ether, polyfluoroalkyl acrylate or a combination thereof.

The adhesion promoter can include vinyl trimethoxysilane, vinyl triethoxysilane, vinyl tris(2-methoxyethoxy)silane, N-(2-aminoethyl)-3-aminopropylmethyl dimethoxysilane, N-(2-aminoethyl)-3-aminopropyl trimethoxysilane, 3-aminopropyl triethoxysilane, 3-glycidoxypropyl trimethoxysilane, 3-glycidoxymethyl propyldimethoxysilane, 2-(3,4-epoxycyclohexyl)ethyl trimethoxysilane, 3-chloromethylpropyl dimethoxysilane, 3-chloropropyl trimethoxysilane, 3-methylallyloxypropyl trimethoxysilane, 3-mercaptopropyl trimethoxysilane or a combination thereof.

The examples of the antioxidant can include 2,2-thiobis(4-methyl-6-tertbutylphenol), 2,6-di-tertbutylphenol or a combination thereof.

The examples of the ultraviolet absorber can include 2-(3-tertbutyl-5-methyl-2-hydroxyphenyl)-5-chlorophenylazide, alkoxyphenyl ketone or a combination thereof.

The examples of the anti-agglutinant can include sodium polyacrylate or the like.

Based on the total amount of the alkali-soluble resin (B) as 100 parts by weight, an amount of the additive (G) is 0 parts by weight to 100 parts by weight, preferably is 1 part by weight to 80 parts by weight, and more preferably is 5 parts by weight to 60 parts by weight.

Preparation of Photosensitive Resin Composition for Color Filter

The photosensitive resin composition for the color filter of the present invention is prepared by mixing the aforementioned pigment (A), the alkali-soluble resin (B), the compound having the ethylenically unsaturated group (C), the photo-initiator (D) and the organic solvent (E) in a mixer uniformly until all components are formed into a solution state, optionally adding the dye (F) and the additive (G) if necessary.

Method of Producing Color Filter

The present invention also provides a method of producing a color filter, which uses the aforementioned photosensitive resin composition of the color filter to form a pixel layer, hereinafter as a pixel color layer.

The present invention also provides a color filter, which is produced by the aforementioned producing method.

The method of producing the color filter sequentially includes a step of producing a photosensitive layer formed by the photosensitive resin composition of the color filter, a step of exposing the photosensitive layer to cure an exposed area, a step of removing a unexposed area with an alkaline developing solution to form the pattern, a step of recurring the pattern to form a pixel color layer, a step of sputtering an ITO protective film and so on.

In the aforementioned step of producing a photosensitive layer, the aforementioned solution state of the photosensitive resin composition can be coated on a substrate by various coating methods such as spin-coating, cast coating, roll coating or the like.

The aforementioned substrate can be alkali-free glass, Na—Ca glass, hard glass (Pyrex glass), a quartz glass, those having a transparent electrically conductive film disposed thereon or a substrate (for example, silicone substrate) used in light-to-electricity conversion (for example, solid-camera device).

In addition, before the photosensitive resin composition is coated on the substrate, the black matrix for separating the pixel color layer of red, green, blue and the like has been formed on the substrate.

After the coating process, most organic solvent in the photosensitive resin composition is removed by the drying process under reduced pressure. Then, the remaining organic solvent can be completely removed by the pre-baking process so as to form a prebaked coating film.

The drying process under reduced pressure is carried out in various conditions. Typically, the drying process under reduced pressure is performed under 0 to 200 torrs for 1 to 60 seconds depending upon the kinds and the mixing ratio of the compounds. The pre-baking process is typically performed under 70° C. to 110° C. for 1 to 15 minutes.

In the aforementioned exposure step, the prebaked coating film is exposed under a mask having specific patterns. The exposure light is preferably UV light such as g-line, h-line, i-line and so on, which may be generated by a UV illumination device such as (super) high-pressure mercury lamp or metal halide lamp.

In the aforementioned step of developing, the prebaked and coated film is immersed in a developing solution under 21° C. to 25° C. for 15 seconds to 5 minutes, thereby removing undesired portions of the exposed prebaked coating film and forming a semi-finished product having a pixel color layer with a given pattern.

The aforementioned developing solution can be alkaline solution such as sodium hydroxide, potassium hydroxide, sodium carbonate, sodium bicarbonate, potassium carbonate, potassium bicarbonate, sodium silicate, sodium methyl silicate, ammonia solution, ethylamine, diethylamine, dimethylethylanolamine, tetramethylammonium hydroxide, tetraethylammonium hydroxide, choline, pyrrole, piperidine, 1,8-diazabicyclo-(5,4,0)-7-undecene or the like.

The concentration of the developing solution is 0.001 wt % to 10 wt %, preferably 0.005 wt % to 5 wt %, and more preferably 0.01 wt % to 1 wt %.

In the aforementioned recurring step, the substrate (having the semi-finished product of the pixel color layer having the given pattern disposed thereon) is washed by water to remove undesired portions of the exposed, prebaked and coated film. The semi-finished product having the pixel color layer with the given pattern is dried by using compressed air or nitrogen gas. Then, the semi-finished product having the pixel color layer with the given pattern is subjected to a post-bake treatment with a heating device such as a hot plate or an oven. The post-bake treatment can be carried out under 150° C. to 250° C. for 5 minutes to 60 minutes on the hot plate or for 15 minutes to 150 minutes in the oven, thereby curing the semi-finished product having the pixel color layer with the given pattern and forming a pixel color layer.

The pixel color layers of red, green, blue and the like can be formed sequentially on the substrate by repeating the aforementioned steps.

In the aforementioned step of sputtering the ITO protective film, the ITO protective film is sputtered on the surface of the pixel color layer at 220° C. to 250° C. under vacuum environment. The ITO protective film is etched and wired if necessary, and then a liquid crystal (LC) alignment film is coated on the surface of the ITO protective film, so as to produce the color filter with the pixel layer.

Method of Producing LCD

The present invention also provides a LCD, which includes the aforementioned color filter.

The color filter and a substrate that has thin film transistor (TFT) are oppositely disposed. A cell gap is firstly interposed between the aforementioned two substrates. Next, the surrounding of the color filter and the substrate is sealed by an adhesive, and a gap-hole is left. Then, liquid crystal (LC) is injected from the gap-hole into a space defined by a surface of the substrate and the adhesive, and the gap-hole is sealed to form a LC layer. And then, a polarized plate is adhered on a side that does not contact the LC layer of the color filter and on an another side that does not contact the LC layer of the substrate, so as to fabricate the LCD device.

The aforementioned LC can be a LC compound or a LC composition without specific limitations.

Moreover, the alignment film of the color filter is used to control the alignment of the LC molecule. The alignment film can be inorganic compounds or organic compounds without specific limitations to the aforementioned examples in the present invention.

Hereinafter, several embodiments are described below to illustrate the application of the present invention. However, these embodiments are not used for limiting the present invention. For those skilled in the art of the present invention, various variations and modifications can be made without departing from the spirit and scope of the present invention.

BRIEF DESCRIPTION OF THE DRAWINGS

The invention can be more fully understood by reading the following detailed description of the embodiment, with reference made to the accompanying drawings as follows.

DETAILED DESCRIPTION

Preparation of First Alkali-Soluble Resin (B-1)

Figure 1:
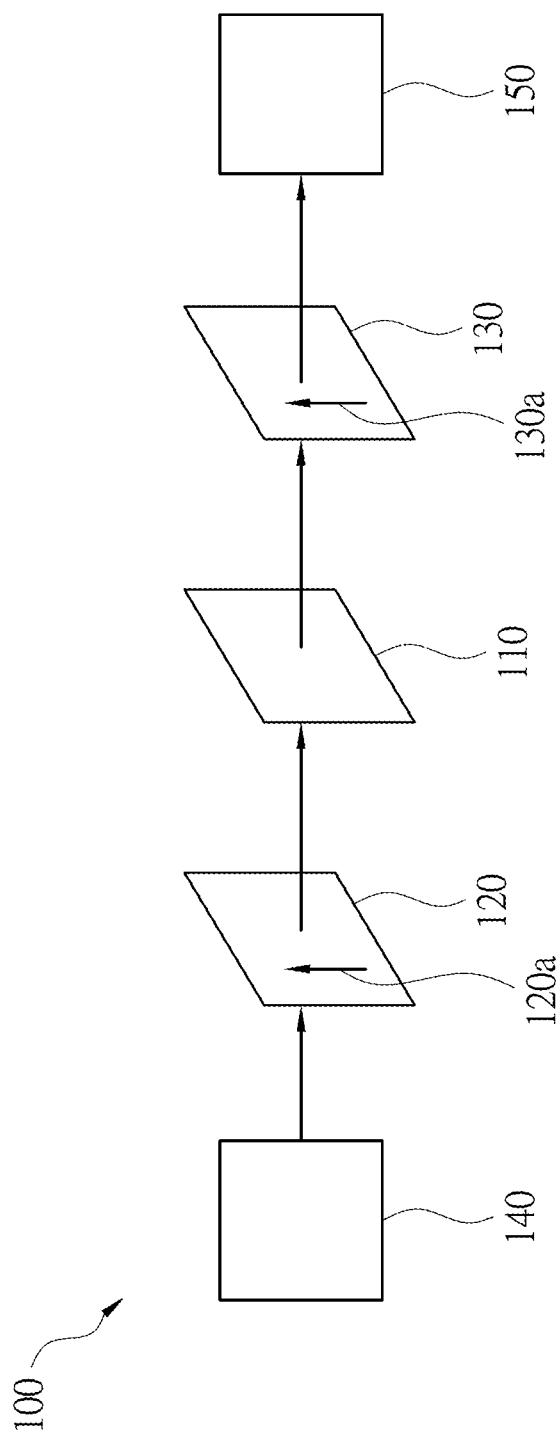
FIG. 1 is a stereo diagram of a device of detecting contrast according to an evaluated method of the present invention.

Hereinafter, the first alkali-soluble resins of synthesis examples B-1-1 to B-1-14 were prepared according to Table 1.

Synthesis Example B-1-1

5 parts by weight of 1,2,2,6,6-pentamethylpiperidyl methacrylate (hereinafter as b1-1-1), 10 parts by weight of 3-(methacryloyloxy)oxetane, 25 parts by weight of 2-methacryloylethoxy succinate (hereinafter as HOMS), 20 parts by weight of dicyclopentenyl acrylate (hereinafter as FA-511A), 25 parts by weight of styrene (hereinafter as SM), 5 parts by weight of benzyl methacrylate (hereinafter as BzMA), 10 parts by weight of methyl methacrylate (hereinafter as MMA) were dissolved in 200 parts by weight of ethyl 3-ethoxypropionate (hereinafter as EEP), and the aforementioned monomers were fed continuously.

After mixed uniformly, the temperature of the oil bath was elevated to 100° C. Then, 4 parts by weight of 2,2'-azobis-2-methyl butyronitrile (hereinafter as AMBN) was dissolved in ethyl 3-ethoxypropionate (EEP), and the solution containing AMBN was separated to five equal parts. The five parts were added into the four-necked conical flask in one hour.

The reaction temperature of the polymerization process was kept 100° C., and the polymerization time was continued for 6 hrs. After the polymerization process, the polymerized product was obtained from the four-necked conical flask and the solvent was devolatilized so as to produce the first alkali-soluble resin (hereinafter as B-1-1) of synthesis example B-1-1.

Synthesis Examples B-1-2 to B-1-14

Synthesis Examples B-1-2 to B-1-14 were practiced with the same method as Synthesis Example B-1-1 by using various kinds and amounts of the components of the first alkali-soluble resin and various polymerization conditions. The formulations and polymerization conditions thereof were listed in Table 1 rather than focusing or mentioning them in details. Besides, in Table 1, "continuously fed" represents that the copolymerized monomers were fed continuously into a reactor, the reaction was performed continuously, and the products were fed out continuously; or "one-time fed" represents that the copolymerized monomers were fed into the reactor in one-time, and the products were fed out in one-time when the reaction was completed.

Preparation of Second Alkali-Soluble Resin (B-2)

Synthesis Example B-2-1

100 parts by weight of fluorene epoxy compound (ESF-300, manufactured by Nippon Steel Chemical Co., and the epoxy equivalent is 231), parts by weight of acrylic acid, 0.3 parts by weight of benzyltriethylammonium chloride, 0.1 parts by weight of 2,6-di-t-butyl-p-cresol, and 130 parts by weight of propylene glycol monomethyl ether acetate were continuously fed into a 500 ml four-necked flask, and a feeding rate was controlled at 25 parts by weight/minute. The reacting temperature is maintained at 100° C. to 110° C. After 15 hours, a light yellowish transparent mixing solution with a solid concentration of 50 wt % can be obtained.

Next, 100 parts by weight of the aforementioned mixing solution was dissolved in 25 parts by weight of ethylene glycol monoethyl ether acetate, and 6 parts by weight of tetrahydrophthalic anhydride and 13 parts by weight of benzophenone tetracarboxylic dianhydride were added at the same time, so as to form a solution. The solution was heated to 110° C. to 115° C. to subject to a reaction. After 2 hours, the second alkali-soluble resin (hereinafter as B-2-1) of Synthesis Example B-2-1 can be obtained. The acid value thereof is 98 mgKOH/g, and a weight average molecule weight is 2205.

Synthesis Example B-2-2

100 parts by weight of fluorene epoxy compound (ESF-300, manufactured by Nippon Steel Chemical Co., and the epoxy equivalent is 231), 30 parts by weight of acrylic acid, 0.3 parts by weight of benzyltriethylammonium chloride, 0.1 parts by weight of 2,6-di-t-butyl-p-cresol, and 130 parts by weight of propylene glycol monomethyl ether acetate were continuously fed into a 500 ml four-necked flask, and a feeding rate was controlled at 25 parts by weight/minute. The reacting temperature is maintained at 100° C. to 110° C. After 15 hours, a light yellowish transparent mixing solution with a solid concentration of 50 wt % can be obtained.

Next, 100 parts by weight of the aforementioned mixing solution was dissolved in 25 parts by weight of ethylene glycol monoethyl ether acetate, and 13 parts by weight of benzophenone tetracarboxylic dianhydride was added at the same time, so as to form a solution. The solution was heated to 90° C. to 95° C. to subject to a reaction. After 4 hours, the second alkali-soluble resin (hereinafter as B-2-2) of Synthesis Example B-2-2 can be obtained. The acid value thereof is 99.0 mgKOH/g, and a weight average molecule weight is 2630.

Synthesis Example B-2-3

400 parts by weight of epoxy compound (NC-3000, manufactured by Nippon Kayaku Co. Ltd., and the epoxy equivalent is 288), 102 parts by weight of acrylic acid, 0.3 part by weight of methoxyphenol, 5 parts by weight of triphenyl phosphine, and 264 parts by weight of propylene glycol monomethyl ether acetate were fed into a reaction flask and subjected to a reaction. The reacting temperature was maintained at 95° C. for 9 hours to obtain an intermediate product with an acid value of 2.2 mgKOH/g. Next, 151 parts by weight of tetrahydrophthalic anhydride was added and a reaction was performed at 95° C. for 4 hours to obtain the second alkali-soluble resin (hereinafter as B-2-3) of Synthesis Example B-2-3. The acid value thereof is 102 mgKOH/g, and a weight average molecule weight is 3200.

Preparation of Photosensitive Resin Composition

The photosensitive resin compositions of Examples 1 to 12 and Comparative Examples 1 to 8 were prepared according to Table 2 and Table 3.

Example 1

30 parts by weight of the pigment (it is a mixture of C.I. Pigment R254 and C.I. Pigment Y139, and the mixing ratio of C.I. Pigment R254 and C.I. Pigment Y139 is 80/20; hereinafter as A-1), 100 parts by weight of the first alkali-soluble resin (B-1-1), 40 parts by weight of 10 parts by weight of dipentaerythritol hexaacrylate (hereinafter as C-1), 3 parts by weight of 2-methyl-1-(4-methylthiophenyl)-2-morpholino-1-propanone (hereinafter as D-1), 3 parts by weight of 2,2'-bis(2,4-dichlorophenyl)-4,4',5,5'-tetraphenyl-biimidazole (hereinafter as D-2), 4 parts by weight of 4,4'-bis(diethylamine) benzophenone (hereinafter as D-3) and 0.1 parts by weight of 2,2-thio bis(4-methyl-6-tertbutylphenol) (hereinafter as G-2) were added into 500 parts by weight of ethyl 3-ethoxypropionate (hereinafter as E-1). The aforementioned components were mixed in a shaking type stirrer uniformly, so as to produce the photosensitive resin composition of the example 1. The resulted photosensitive resin composition was evaluated according to the following evaluation methods, and the result thereof was listed as Table 2. The evaluation methods of the alkali resistance, the voltage holding ratio and the contrast were described as follows.

Examples 2 to 12 and Comparative Examples 1 to 8

Examples 2 to 12 and Comparative Examples 1 to 8 were prepared with the same method as in Example 1 by using various kinds and amounts of the components of the photosensitive resin compositions. The formulations and the evaluation results were shown in Tables 2 and 3 rather than mentioning them in details.

Evaluation Methods

1. Alkali Resistance

The photosensitive resin composition of the examples 1 to 12 and comparative examples 1 to 8 were coated on glass substrates, and the size of the glass substrate was 100 mm×100 mm. Next, a reduced-pressure drying was subjected to the glass substrate for 30 seconds under 100 mmHg. Then, the aforementioned glass substrate was prebaked for 2 minutes at 80° C. to form a prebaked coating film with 2.5 μm in thickness.

Next, the prebaked coating film was exposed to 100 mJ/cm² UV light (the trade name of the exposing device was Canon PLA-501F). Then, the film was baked at 235° C. for 30 minutes, so as to form a photosensitive resin layer of 2.0 μm in thickness on the glass substrate.

The chromaticity (L*, a*, b*) of the photosensitive resin layer was measured by the chromaticity meter manufactured by Otsuka Electronics Co. Ltd. (the trade name was MCPD). Thereafter, the film was immersed an alkaline solution (potassium hydroxide, and the concentration is 0.5 wt. %) at 23° C. for 60 minutes, and the chromaticity was measured again. A chromaticity difference (ΔEab*) was calculated according to the following Formula (X), and an evaluation was made according to the following criterion.

$$\Delta Eab^* = [(\Delta L)^2 + (\Delta a)^2 + (\Delta b)^2]^{1/2} \quad (X)$$

☆: ΔEab*<1
◉: 1≤ΔEab*<2
○: 2≤ΔEab*<4
Δ: 4≤ΔEab*<6
X: 6≤ΔEab*

2. Voltage Holding Ratio

Firstly, a $SiO_2$ film was formed on a Na—Ca glass substrate for preventing sodium ions from being dissolved out, and then an ITO (Indium Tin Oxide) electrode with a given pattern was further evaporated on the Na—Ca glass substrate. And then, the photosensitive resin compositions of the aforementioned Examples 1 to 12 and Comparative Examples 1 to 8 were spin-coated on the aforementioned glass substrate. Next, the substrate was prebaked at 100° C. for 1 minute to form a prebaked coating film with a thickness of 2.0 μm. Then, the aforementioned prebaked coating film was irradiated under the light of 700 J/m² without covering the mask. The post-exposure coating film was immersed in a potassium hydroxide developing solution with the concentration of 0.04 wt %. After 1 minute, the substrate was cleaned by ultrapure water and air-dried. And then, the post-exposure coating film was post-baked for 30 minutes at 230° C., thereby forming a cured coating film.

Next, a sealing agent was used to adhere the pixel substrate formed by the aforementioned curing coating film and the ITO electrode with the given evaporated pattern, and the glass beads with a diameter of 1.8 mm were placed in between thereof. The LC material (the trade name of MLC6608 was made by Merck Co. Ltd.) was injected into the cell gap defined by the aforementioned sealing agent, the pixel substrate and the driving substrate, so as to form an LC cell.

Then, the produced LC cell was placed into a thermostat at 60° C., and the voltage holding ratio (VHR) of the produced LC cell was measured at a square wave of 5.5 V and a frequency of 60 Hz by a VHR measuring instrument (Model No. VHR-1A was made by Toyo Co.).

The aforementioned VHR denotes a value, which represents a potential difference of the LC cell after 16.7 milliseconds divided by the voltage imposed to the LC cell at 0 milli-second. When the VHR of the LC cell is less than 90%, the produced LC cell is unable to maintain a stable voltage within 16.7 milli-seconds, and the situation easily causes the defect of retained image generated by the LC cell molecules. The measured VHR of the aforementioned Examples 1 to 12 and Comparative Examples 1 to 8 is evaluated by the following criteria:

⊚: 95%<VHR≤100%
○: 90%<VHR≤95%
Δ: 80%<VHR≤90%
X: VHR≤900

3. Contrast

Each photosensitive resin composition of the aforementioned Examples and Comparative Examples was coated on a glass substrate with a size of 100 mm in width and 100 mm in length. Next, the glass substrate was subjected to a reduced-pressure dehydration for 30 seconds under a pressure of 100 mmHg. Then, the aforementioned glass substrate was prebaked for 2 minutes at 80° C. to form a prebaked coating film with 2.5 μm in thickness. Next, the aforementioned prebaked coating film was exposed under 100 mJ/cm² of ultraviolet light by an exposure machine (the trade name of PLA-501F was made by Canon Co. Ltd.). After being exposed under the ultraviolet light, the prebaked coating film was immersed in a developing solution at 23° C. After 1 minute, the prebaked coating film was cleaned by pure water, followed by being postbaked at 235° C. for 30 minutes, so as to form a photosensitive resin layer with 2.0 μm in thickness on the glass substrate.

Figure 2:
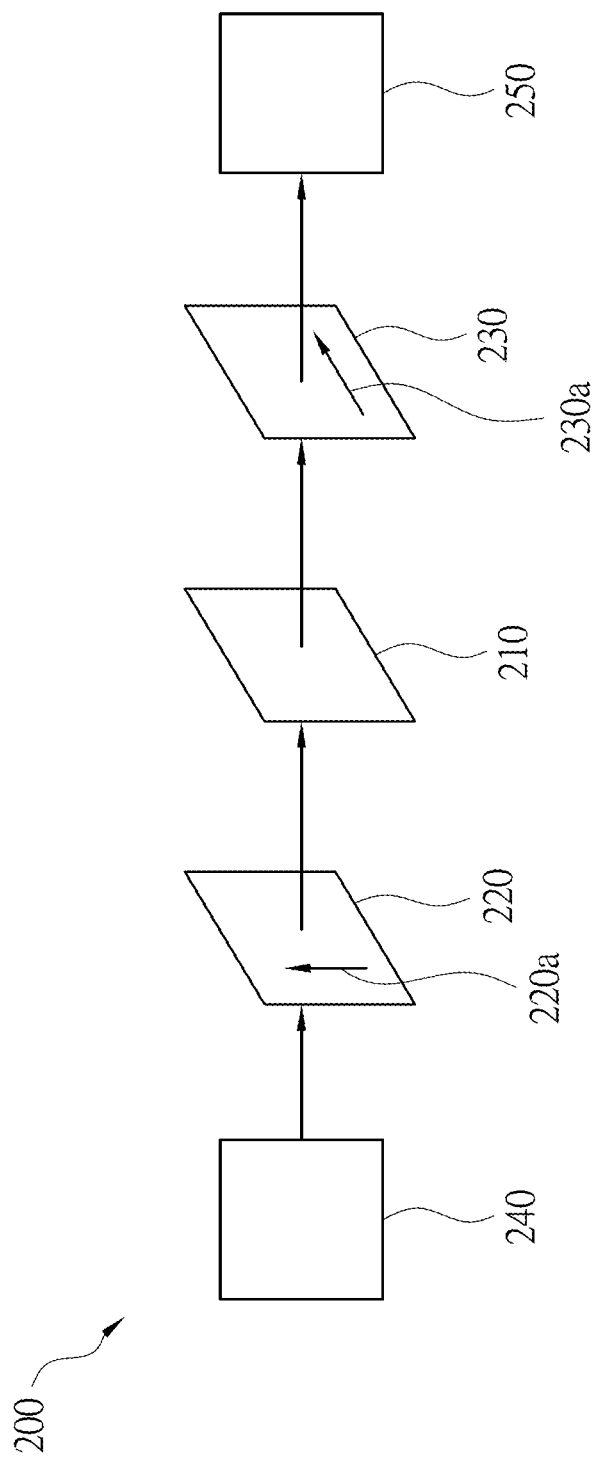
FIG. 2 is a stereo diagram of an another device of detecting contrast according to the evaluated method of the present invention.

A detecting device as illustrated in FIGS. 1 and 2 was used to measure the luminance of the photosensitive resin layer with 2.0 μm in thickness and compute a ratio thereof. In the detecting device 100 of FIG. 1, the aforementioned produced photosensitive resin layer 110 was interposed between the two polarized plates 120 and 130, and the light emitted from the light source 140 passed through the polarized plate 120, the photosensitive resin layer 110 and the polarized plate 130 in sequence. Then, the luminance (cd/cm²) of the light passing through the polarized plate 130 was measured by a luminance meter 150 (the trade name of BM-5A was made by Topcon Co. Ltd.).

Among the aforementioned description, a polarized light direction 120a of the polarized plate 120 was parallel to a polarized light direction 130a of the polarized plate 130, and the luminance measured by the detecting device 100 of FIG. 1 was A. The detecting device 200 illustrated in FIG. 2 was approximately the same as the detecting device 100 illustrated in FIG. 1, but the two detecting devices had some differences. A polarized light direction 220a of a polarized plate 220 was perpendicular to a polarized light direction 230a of a polarized plate 230 in the detecting device 200, and the luminance measured by the device 200 was B.

Then, the contrast of the photosensitive resin composition was defined as the following formula (XI) and evaluated according to the following criterion:

$$\text{Contrast} = \frac{\text{Luminance } A}{\text{Luminance } B} \quad (XI)$$

⊚: 1500≤contrast
○: 1200≤contrast<1500
Δ: 900≤contrast<1200
X: contrast<900

According to the results of Table 2 and Table 3, when the first alkali-soluble resin (B-1) of the alkali-soluble resin (B) includes a copolymerized monomer of the ethylenically monomer having a hindered-amine structure (b1-1), the photosensitive resin composition has excellent voltage holding ratio.

Moreover, when the first alkali-soluble resin (B-1) of the alkali-soluble resin (B) includes a copolymerized monomer of the ethylenically unsaturated monomer having an oxetanyl group (b1-2), the photosensitive resin composition has better alkali-resistance. When the ethylenically unsaturated monomer having an oxetanyl group (b1-2) includes the unsaturated monomer having a structure of Formula (II), the photosensitive resin composition has much better alkali resistance.

Furthermore, when the alkali-soluble resin (B) comprises the second alkali-soluble resin (B-2), the photosensitive resin composition has better alkali resistance.

Beside, when the photosensitive resin composition includes the dye (F), the photosensitive resin composition has better contrast.

It should be supplemented that, although specific compounds, components, specific reaction conditions, specific processes, specific evaluation methods or specific instruments are employed as exemplary embodiments of the present invention, for illustrating the photosensitive resin composition and the application of the same of the present invention. However, as is understood by a person skilled in the art instead of limiting to the aforementioned examples, the photosensitive resin composition and the application of the same of the present invention also can be manufactured by using other compounds, components, reaction conditions, processes, evaluation methods and instruments without departing from the spirit and the scope of the present invention.

As is understood by a person skilled in the art, the foregoing preferred embodiments of the present invention are illustrated of the present invention rather than limiting of the present invention. In view of the foregoing, it is intended to cover various modifications and similar arrangements included within the spirit and the scope of the appended claims. Therefore, the scope of which should be accorded the broadest interpretation so as to encompass all such modifications and similar structures.

TABLE 1

| Synthesis Examples | Composition (parts by weight) Copolymerized Monomer | | | | | | | | | | |
|---|---|---|---|---|---|---|---|---|---|---|---|
| | b1-1 | | | b1-2 | | | | | b1-3 | | b1-4 |
| | b1-1-1 | b1-1-2 | MATP | OXMA | EOXMA | MOXMA | MOXV | EOXV | HOMS | MM | AA | FA-511A |
| B-1-1 | 5 | | | 10 | | | | | 25 | | | 20 |
| B-1-2 | | 10 | | | 40 | | | | | 10 | 15 | |
| B-1-3 | | | 15 | | | 60 | | | | | 10 | |
| B-1-4 | 20 | | | 20 | 10 | | | | 30 | | | 10 |
| B-1-5 | | 20 | | | 50 | | | | | 15 | | |
| B-1-6 | | | 30 | | | 30 | | | 40 | | | |
| B-1-7 | 20 | 20 | | | | | 25 | | | 20 | | |
| B-1-8 | | 20 | 30 | | | | | 25 | | | 15 | |
| B-1-9 | | | 15 | | | | | | 25 | | | 20 |
| B-1-10 | | | | | 40 | | | | | 10 | 15 | |
| B-1-11 | 5 | | | | | | | | 25 | | | 20 |
| B-1-12 | | 10 | | | | | | | | 10 | 15 | |
| B-1-13 | | | | | | | | | 25 | | | 10 |
| B-1-14 | | | | | | | | | | | 20 | |

| Synthesis Examples | Composition (parts by weight) | | | | | Initiator | | Solvent | Polymerized Parameter | | |
|---|---|---|---|---|---|---|---|---|---|---|---|
| | Copolymerized Monomer b1-4 | | | | | | | | Method of Adding Monomer | Reacting Temperature (°C.) | Polymerized Time (hour) |
| | FA-512A | SM | BzMA | MMA | GMA | AMBN | ADVN | EEP | | | |
| B-1-1 | | 25 | 5 | 10 | | 4 | | 200 | Continuously Fed | 100 | 6 |
| B-1-2 | 15 | | 10 | | | 4.5 | | 200 | One-time Fed | 105 | 6 |
| B-1-3 | | 10 | | 5 | | 4 | | 200 | Continuously Fed | 100 | 5.5 |
| B-1-4 | | | 5 | | 5 | | 4 | 200 | One-time Fed | 105 | 6 |
| B-1-5 | 5 | | 5 | 5 | | 4 | | 200 | Continuously Fed | 100 | 6 |
| B-1-6 | | | | | | 4.5 | | 200 | One-time Fed | 105 | 6 |
| B-1-7 | | 10 | | | 5 | 4 | | 200 | Continuously Fed | 100 | 5.5 |
| B-1-8 | 5 | | 5 | | | | 4 | 200 | One-time Fed | 105 | 6 |
| B-1-9 | | 25 | 5 | 10 | | 4 | | 200 | Continuously Fed | 100 | 6 |
| B-1-10 | 20 | | 15 | | | 4.5 | | 200 | One-time Fed | 105 | 6 |
| B-1-11 | | 25 | 10 | 15 | | 4 | | 200 | Continuously Fed | 100 | 6 |
| B-1-12 | 15 | | 10 | | 40 | 4.5 | | 200 | One-time Fed | 105 | 6 |
| B-1-13 | | 35 | | 30 | | 4 | | 200 | Continuously Fed | 100 | 5.5 |
| B-1-14 | 35 | 30 | | | 15 | | 4 | 200 | One-time Fed | 105 | 6 |

| | | | |
|---|---|---|---|
| b1-1-1 | 1,2,2,6,6-pentamethyl-piperidyl methacrylate | AA | acrylic acid |
| b1-1-2 | 2,2,6,6-tetramethyl-piperidyl methacrylate | FA-511A | dicyclopenteny acrylate |
| MATP | 4-methacrylamido-2,2,6,6-tetramethylpiperidine | FA-512A | dicyclopentenyloxyethyl acrylate |
| OXMA | 3-(methacryloyloxy)oxetane | SM | styrene monomer |
| EOXMA | 3-(methacryloyloxy)-3-ethyloxetane | BzMA | benzyl methacrylate |
| MOXMA | 3-(methacryloyloxy)-3-methyloxetane | MMA | methyl methacrylate |
| MOXV | 3-methyl-3-(vinyloxy)oxetane | GMA | Glycidyl methacrylate |
| EOXV | 3-ethyl-3-(vinyloxy)oxetane | AMBN | 2,2'-azobis-2-methyl butyronitrile |
| HOMS | 2-methacryloyloxyethyl succinate monoester | ADVN | 2,2'-Azobis(2,4-dimethylvaleronitrile) |
| MM | methacrylic acid | EEP | ethyl 3-ethoxypropionate |

TABLE 2

| Composition (parts by weight) | | | Example 1 | 2 | 3 | 4 | 5 | 6 | 7 | 8 | 9 | 10 | 11 | 12 |
|---|---|---|---|---|---|---|---|---|---|---|---|---|---|---|
| Pigment (A) | A-1 | | 30 | | | 100 | | | 150 | | | 240 | | |
| | A-2 | | | 60 | | | 120 | | | 180 | | | 270 | |
| | A-3 | | | | 90 | | | 150 | | | 210 | | | 300 |
| Alkali-soluble Resin (B) | First Alkali-soluble Resin (B-1) | B-1-1 | 100 | | | | | | | | 90 | | | |
| | | B-1-2 | | 100 | | | | | | | | 70 | | |
| | | B-1-3 | | | 100 | | | | | | | | 50 | |
| | | B-1-4 | | | | 100 | | | | | | | | 30 |
| | | B-1-5 | | | | | 100 | | | | 10 | | | |
| | | B-1-6 | | | | | | 100 | | | | | | |
| | | B-1-7 | | | | | | | 100 | | | | | |
| | | B-1-8 | | | | | | | | 100 | | | | |
| | | B-1-9 | | | | | | | | | | | | |
| | | B-1-10 | | | | | | | | | | | | |
| | | B-1-11 | | | | | | | | | | | | |
| | | B-1-12 | | | | | | | | | | | | |
| | | B-1-13 | | | | | | | | | | | | |
| | | B-1-14 | | | | | | | | | | | | |
| | Second Alkali-soluble Resin (B-2) | B-2-1 | | | | | | | | | | 30 | | |
| | | B-2-2 | | | | | | | | | | | 50 | |
| | | B-2-3 | | | | | | | | | | | | 70 |
| Compound Having an Ethylenically Unsaturated Group (C) | C-1 | | 40 | | | 150 | | | 250 | | | 300 | | |
| | C-2 | | | 80 | | | 200 | | | 300 | | 50 | 400 | 200 |
| | C-3 | | | | 150 | | | 250 | | | 350 | | | 200 |
| Photo Initiator (D) | D-1 | | 3 | 10 | | 15 | 15 | | 10 | 40 | | 35 | 40 | 50 |
| | D-2 | | 3 | 10 | 15 | 15 | 15 | 20 | 20 | 30 | 20 | 50 | | |
| | D-3 | | 4 | | | | 15 | | | | 30 | | 30 | 25 |
| | D-4 | | | | 20 | 5 | | 30 | 30 | | 30 | | 25 | 25 |
| Organic Solvent (E) | E-1 | | 500 | | 1500 | 1000 | 500 | 2000 | 1500 | 1000 | 3000 | 4500 | 3500 | 5000 |
| | E-2 | | | 1000 | | 1000 | 1500 | 500 | 1000 | 2500 | 1000 | | 1000 | |
| Dye (F) | F-1 | | | | | | | 4 | | | | | | |
| | F-2 | | | | 15 | | | | | | | | | |
| | F-3 | | | | | | | | | | | | 40 | |
| Additive (G) | G-1 | | | | | | | 1 | | | | | | |
| | G-2 | | 0.1 | | | | | | | | | | | 5 |
| | G-3 | | | | | | | | | | | | | |
| | G-4 | | | | | | | | | | | | | |
| | G-5 | | | | | | | | | | | | | |
| Evaluation Method | Alkali Resistance | | ◎ | ◎ | ◎ | ◎ | ◎ | ◎ | ○ | ○ | ◎ | ☆ | ☆ | ☆ |
| | VHR | | ◎ | ◎ | ◎ | ◎ | ◎ | ◎ | ◎ | ◎ | ◎ | ◎ | ◎ | ◎ |
| | Contrast | | ○ | ○ | ◎ | ◎ | ◎ | ◎ | ○ | ○ | ○ | ○ | ◎ | ○ |

| | |
|---|---|
| A-1 | C.I.Pigment R254/C.I.Pigment Y139 = 80/20 |
| A-2 | C.I.Pigment G36/C.I.Pigment Y150 = 60/40 |
| A-3 | C.I.Pigment B15:6 |
| C-1 | dipentaerythritol hexaacrylate (manufactured by Toagosei Co. Ltd.) |
| C-2 | ethoxylated Pentaerythritol tetraacrylate |
| C-3 | KAYARAD DPCA-20 (manufactured by Nippon Kayaku Co. Ltd.) |
| D-1 | 2-methyl-1-(4-methylthiophenyl)-2-morpholino-1-propanone |
| D-2 | 2,2'-bis(2,4-dichlorophenyl)-4,4',5,5'-tetraphenyl biimidazole |
| D-3 | 4,4-'bis(diethylamine) benzophenone |
| D-4 | 1[4-(phenyl thio)phenyl]-octane-1,2-dione-2-(O-benzoyl oxime) |
| E-1 | ethyl 3-ethoxypropionate |
| E-2 | propylene glycol methyl ether acetate |
| F-1 | C.I. Acid Blue 25 |
| F-2 | C.I. Acid Red 289 |
| F-3 | C.I. Acid Green 5 |
| G-1 | 3-sulfanol propyl trimethoxysilane |
| G-2 | 2,2-thio bis(4-methyl-6-tertbutylphenol) |
| G-3 | epoxypropyl methacrylate |
| G-4 | 1,2,2,6,6-pentamethylpiperidyl methacrylate |
| G-5 | 3-(methacryloylmethoxy)-3-methyloxetane |

TABLE 3

| Composition (parts by weight) | | Comparative Example 1 | 2 | 3 | 4 | 5 | 6 | 7 | 8 |
|---|---|---|---|---|---|---|---|---|---|
| Pigment (A) | A-1 | 100 | | | 100 | | | 100 | |
| | A-2 | | 120 | | | 120 | | | 120 |
| | A-3 | | | 150 | | | 150 | | |

TABLE 3-continued

| Composition (parts by weight) | | | Comparative Example 1 | 2 | 3 | 4 | 5 | 6 | 7 | 8 |
|---|---|---|---|---|---|---|---|---|---|---|
| Alkali-soluble Resin (B) | First Alkali-soluble Resin (B-1) | B-1-1 | | | | | | | | |
| | | B-1-2 | | | | | | | | |
| | | B-1-3 | | | | | | | | |
| | | B-1-4 | | | | | | | | |
| | | B-1-5 | | | | | | | | |
| | | B-1-6 | | | | | | | | |
| | | B-1-7 | | | | | | | | |
| | | B-1-8 | | | | | | | | |
| | | B-1-9 | 100 | | | | | | 30 | |
| | | B-1-10 | | 100 | | | | | | 70 |
| | | B-1-11 | | | 100 | | | | 70 | |
| | | B-1-12 | | | | 100 | | | | 30 |
| | | B-1-13 | | | | | 100 | | | |
| | | B-1-14 | | | | | | 100 | | |
| | Second Alkali-soluble Resin (B-2) | B-2-1 | | | | | | | | |
| | | B-2-2 | | | | | | | | |
| | | B-2-3 | | | | | | | | |
| Compound Having an Ethylenically Unsaturated Group (C) | | C-1 | 150 | | | 150 | | | 150 | |
| | | C-2 | | 200 | | | 200 | | | 200 |
| | | C-3 | | | 250 | | | 250 | | |
| Photo Initiator (D) | | D-1 | 15 | 20 | | 20 | 15 | | 15 | 15 |
| | | D-2 | 15 | 10 | 20 | 10 | 15 | 20 | 10 | 10 |
| | | D-3 | | | 15 | | 15 | | | 20 |
| | | D-4 | 5 | 30 | | 5 | | 30 | 10 | |
| Organic Solvent (E) | | E-1 | 1000 | 500 | 2000 | 1000 | 500 | 2000 | 1000 | 500 |
| | | E-2 | 1000 | 1500 | 500 | 1000 | 1500 | 500 | 1000 | 1500 |
| Dye (F) | | F-1 | | | | | | | | |
| | | F-2 | | | | | | | | |
| | | F-3 | | | | | | | | |
| Additive (G) | | G-1 | | | | | | | | |
| | | G-2 | | | | | | | | |
| | | G-3 | | | | 10 | | | | |
| | | G-4 | | | | | | | 20 | |
| | | G-5 | | | | | 10 | | | |
| Evaluation Method | | Alkali Resistance | Δ | Δ | X | X | X | X | Δ | Δ |
| | | VHR | X | X | Δ | Δ | X | X | Δ | Δ |
| | | Contrast | X | X | X | X | X | X | X | X |

A-1    C.I.Pigment R254/C.I.Pigment Y139 = 80/20
A-2    C.I.Pigment G36/C.I.Pigment Y150 = 60/40
A-3    C.I.Pigment B15:6
C-1    dipentaerythritol hexaacrylate (manufactured by Toagosei Co. Ltd.)
C-2    ethoxylated Pentaerythritol tetraacrylate
C-3    KAYARAD DPCA-20 (manufactured by Nippon Kayaku Co. Ltd.)
D-1    2-methyl-1-(4-methylthiophenyl)-2-morpholino-1-propanone
D-2    2,2'-bis(2,4-dichlorophenyl)-4,4',5,5'-tetraphenyl biimidazole
D-3    4,4-'bis(diethylamine) benzophenone
D-4    1[4-(phenyl thio)phenyl]-octane-1,2-dione-2-(O-benzoyl oxime)
E-1    ethyl 3-ethoxypropionate
E-2    propylene glycol methyl ether acetate
F-1    C.I. Acid Blue 25
F-2    C.I. Acid Red 289
F-3    C.I. Acid Green 5
G-1    3-sulfanol propyl trimethoxysilane
G-2    2,2-thio bis(4-methyl-6-tertbutylphenol)
G-3    epoxypropyl methacrylate
G-4    1,2,2,6,6-pentamethylpiperidyl methacrylate
G-5    3-(methacryloylmethoxy)-3-methyloxetane

What is claimed is:

1. A photosensitive resin composition for a color filter, comprising:
a pigment (A);
an alkali-soluble resin (B);
a compound having an ethylenically unsaturated group (C);
a photo initiator (D); and
an organic solvent (E), and
wherein the alkali-soluble resin (B) includes a first alkali-soluble resin (B-1), the first alkali-soluble resin (B-1) is copolymerized by a first mixture, and the first mixture at least includes an ethylenically unsaturated monomer having a structure of hindered amine (b1-1), an ethylenically unsaturated monomer having an oxetanyl (b1-2), an ethylenically unsaturated monomer having a carboxylic acid group (b1-3) and an other copolymerizable ethylenically unsaturated monomer (b1-4) except from the ethylenically monomer having a hindered-amine structure (b1-1), the ethylenically unsaturated monomer having an oxetanyl group (b1-2) and the ethylenically unsaturated monomer having a carboxyl group (b1-3), wherein based on a total amount of the ethylenically monomer having a hindered-amine structure (b1-1), the ethylenically unsaturated monomer having an oxetanyl group (b1-2), the ethylenically unsaturated monomer having a carboxyl group (b1-3), and the other copolymerizable ethylenically unsaturated monomer (b1-4) as 100 parts by weight, an amount of the ethylenically unsaturated monomer having an oxetanyl group (b1-2) is 15 parts by weight to 60 parts by weight.

2. The photosensitive resin composition for the color filter of claim 1, wherein the ethylenically unsaturated monomer having a structure of hindered amine (b1-1) includes an unsaturated monomer having a structure of Formula (I):

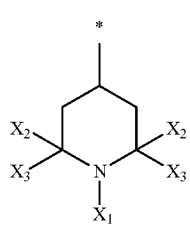

(I)

in Formula (I), the $X_1$ represents a hydrogen atom, a linear alkyl group of 1 to 18 carbons, a branched alkyl group of 3 to 18 carbons, a cycloalkyl group of 3 to 18 carbons, an aromatic alkyl group of 6 to 20 carbons, an aromatic alkyl group, an acyl group, an oxygen free radical or —$OX_4$; the $X_4$ represents a hydrogen atom, a linear alkyl group of 1 to 18 carbons, branched alkyl group of 3 to 18 carbons or cycloalkyl group of 3 to 18 carbons, an aromatic group of 6 to 20 carbons, or an aromatic alkyl group of 7 to 12 carbons; the $X_2$ and the $X_3$ represents methyl, ethyl, phenyl or aliphatic ring formed by 4 to 12 carbons; and the symbol "*" represents a covalent bond.

3. The photosensitive resin composition for the color filter of claim 1, wherein the ethylenically unsaturated monomer having an oxetanyl (b1-2) includes an unsaturated monomer having a structure of Formula (II):

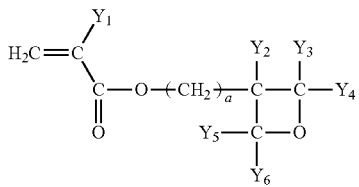

(II)

in the Formula (II), the Y1 represents a hydrogen atom or an alkyl group of 1 to 4 carbons and the $Y_2$ represents a hydrogen atom or an alkyl group of 1 to 4 carbons; the Y3, the Y4, the Y5 and the Y6 individually and independently represent a hydrogen atom, a fluorine atom, a phenyl group, an alkyl group of 1 to 4 carbons or a perfluroalkyl group of 1 to 4 carbons; and the a represents an integer of 1 to 6.

4. The photosensitive resin composition for the color filter of claim 1, wherein based on a total amount of the ethylenically monomer having a hindered-amine structure (b1-1), the ethylenically unsaturated monomer having an oxetanyl group (b1-2), the ethylenically unsaturated monomer having a carboxyl group (b1-3), and the other copolymerizable ethylenically unsaturated monomer (b1-4) as 100 parts by weight, an amount of the ethylenically monomer having a hindered-amine structure (b1-1) is 5 parts by weight to 50 parts by weight, an amount of the ethylenically unsaturated monomer having a carboxyl group (b1-3) is 10 parts by weight to 40 parts by weight, and an amount of the other copolymerizable ethylenically unsaturated monomer (b1-4) is 5 part by weight to 75 parts by weight.

5. The photosensitive resin composition for the color filter of claim 1, wherein the alkali-soluble resin (B) can include a second alkali-soluble resin (B-2), the second alkali-soluble resin (B-2) is synthesized by a second mixture, and the second mixture includes an epoxy compound having at least two epoxy groups (b2-1) and a compound having at least one carboxyl group and at least one ethylenically unsaturated group (b2-2).

6. The photosensitive resin composition for the color filter of claim 5, wherein the epoxy compound having at least two epoxy groups (b2-1) includes a compound having a structure of Formula (III), a compound having a structure of Formula (IV) or a combination thereof:

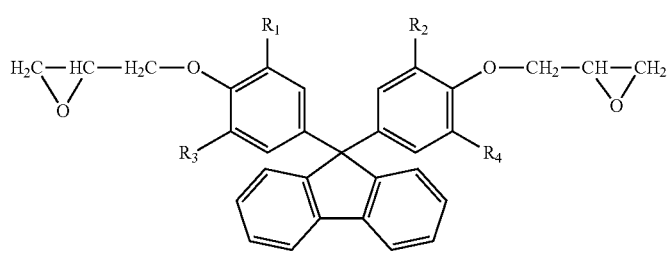

(III)

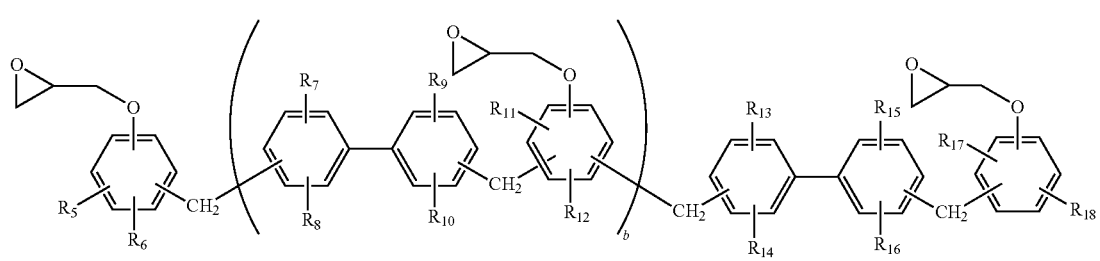

(IV)

in the Formula (III), the $R_1$, the $R_2$, the $R_3$ and the $R_4$ are independently represent a hydrogen atom, a halogen atom, an alkyl group of 1 to 5 carbons, an alkoxy group of 1 to 5 carbons, an aryl group of 1 to 12 carbons or an aralkyl group of 6 to 12 carbons; in the Formula (IV), the $R_5$ to the $R_{18}$ independently represent a hydrogen atom, a halogen atom, an alkyl group of 1 to 8 carbons, an aryl group of 6 to 15 carbons, and b represents an integer from 0 to 10.

7. The photosensitive resin composition for the color filter of claim 5, wherein based on a total amount of the alkali-soluble resin (B) as 100 parts by weight, an amount of the second alkali-soluble resin (B-2) is 30 parts by weight to 70 parts by weight.

8. The photosensitive resin composition for the color filter of claim 1, further comprising a dye (F).

9. The photosensitive resin composition for the color filter of claim 8, wherein based on a total amount of the alkali-soluble resin (B) as 100 parts by weight, an amount of the dye (F) is 4 parts by weight to 40 parts by weight.

10. The photosensitive resin composition for the color filter of claim 1, wherein based on a total amount of the alkali-soluble resin (B) as 100 parts by weight, an amount is the pigment (A) is 30 parts by weight to 300 parts by weight, an amount of the compound having an ethylenically unsaturated group (C) is 40 parts by weight to 400 parts by weight, an amount of the photo initiator (D) is 10 parts by weight to 100 parts by weight, and an amount of the organic solvent (E) is 500 parts by weight to 5000 parts by weight.

11. A method of producing the color filter, wherein a photosensitive resin composition of claim 1 is form to a pixel layer.

12. A color filter, produced by a method of claim 11.

13. A liquid crystal display (LCD) device, comprising a color filter of claim 12.

* * * * *